(12) United States Patent
Stevens et al.

(10) Patent No.: US 7,214,537 B2
(45) Date of Patent: May 8, 2007

(54) REAL-TIME COMPONENT MONITORING AND REPLENISHMENT SYSTEM FOR MULTICOMPONENT FLUIDS

(75) Inventors: Russell Stevens, Austin, TX (US); Thomas Kloffenstein, Morgan Hill, CA (US); Todd Aycock, Austin, TX (US); Joseph W. Evans, Oak Park, IL (US)

(73) Assignee: Advanced Technology Materials, Inc., Danbury, CT (US)

( * ) Notice: Subject to any disclaimer, the term of this patent is extended or adjusted under 35 U.S.C. 154(b) by 574 days.

(21) Appl. No.: 10/264,408

(22) Filed: Oct. 4, 2002

(65) Prior Publication Data
US 2003/0121799 A1  Jul. 3, 2003

Related U.S. Application Data

(60) Provisional application No. 60/328,151, filed on Oct. 8, 2001.

(51) Int. Cl.
*G01N 33/18* (2006.01)
*G01N 31/16* (2006.01)

(52) U.S. Cl. ............................. 436/42; 436/51; 436/52; 422/62; 422/75

(58) Field of Classification Search ............ 422/75–77, 422/62
See application file for complete search history.

(56) References Cited

U.S. PATENT DOCUMENTS

| | | | |
|---|---|---|---|
| 4,190,481 A | 2/1980 | Goffredo | |
| 4,664,756 A * | 5/1987 | Shimizu et al. | 205/788 |
| 5,722,441 A | 3/1998 | Teramoto | |
| 5,746,233 A | 5/1998 | Kuroda et al. | |
| 5,896,874 A | 4/1999 | Nakagawa et al. | |
| 5,910,269 A | 6/1999 | Ono et al. | |
| 6,146,008 A | 11/2000 | Laederich et al. | |
| 6,284,197 B1 | 9/2001 | Abbott et al. | |
| 6,355,407 B1 | 3/2002 | Takamuki et al. | |

FOREIGN PATENT DOCUMENTS

| | | | |
|---|---|---|---|
| JP | 61281532 | | 12/1986 |
| JP | 4278529 | | 10/1992 |
| JP | 5074755 | | 3/1993 |
| JP | 07037851 A | * | 2/1995 |

OTHER PUBLICATIONS

Kohl Photoelectrochemical etching of semiconductors, IBM J. Res. Develop., 1998, v. 42, No. 5, pp. 629-637.*
J. Electrochem Soc. 142 (1995) 1733.
Steigerwald, et al., J. ElectroChem Soc. 141, 2842 (1994).
Brusic, et al., J. Electrochem, Soc. 138, 2253, (1991).
Steigerwald, et al. "Chemical Mechanical Planarization of Microelectronic Materials", Wiley, 1997.

* cited by examiner

*Primary Examiner*—Yelena G. Gakh
(74) *Attorney, Agent, or Firm*—Steven J. Hultquist; Intellectual Property/Technology Law; Maggie Chappuis

(57) ABSTRACT

A multicomponent fluid composition monitoring and compositional control system, in which a component analysis is effected by titration or other analytical procedure, for one or more components of interest, and a computational means then is employed to determine and responsively adjust the relative amount or proportion of the one or more components in the multicomponent fluid composition, to maintain a predetermined compositional character of the multicomponent fluid composition. The system is usefully employed in semiconductor manufacturing photoresist and post-etch residue removal, in which the cleaning medium is a semi-aqueous solvent composition, and water is the monitored and responsively adjusted component.

114 Claims, 18 Drawing Sheets

```
1      ANALYSIS SEQUENCER/METHODS

S1    T1    IF     S1    T2    F1
    0.20        ml<    0.20  R
                0.50         0.10

MAIN      NEXT     UP    DOWN      ENTER
```

FIG.8

```
2    OUTPUT 1: CONC 1 MAX...              10.00
     OUTPUT 2: CONC 2 MAX...              10.00
     RELAY ASSIGNMENTS:
         R1:   OFF              R2:   OFF
         R3:   OFF              R4:   OFF
     MAIN      NEXT     UP    DOWN      ENTER
```

FIG.9

```
3   CALIBRATION TYPE                    PROCESS
    1. CALCULATION FACTOR       1.000
    2. CALCULATION FACTOR       1.000
    3. CALCULATION FACTOR       1.000
    4. CALCULATION FACTOR       1.000
    ANALYZER TRIGGER                    LOCAL
    BUFFER SOLUTIONS     10.00     4.000
    MAIN      NEXT      UP     DOWN      ENTER
```

FIG.10

```
4   TIME (H:MIN:SEC)                    XX:XX:XX
    DATE (DAY/MONTH/YEAR)               XX:XX:XX
    TITRE FREQUENCY (MIN)               15.00
    EQUILIBRATION TIME (SEC)            2.00
    DATA SMOOTHING                      1.00
    ACID CAL                            4.00
    WATER CAL                           1.00
    MAIN      NEXT      UP     DOWN      ENTER
```

FIG.11

| 5 | END POINT (pH/mV) | | 200.00 | 150.00 |
|---|---|---|---|---|
| | WINDOW/SMOOTHING | | 50.00 | 50.00 |
| | END | | 190.00 | 130.00 |
| | SENSOR | | KF | KF |
| | ALGORITHM | | SETPOINT | SETPOINT |
| | DIRECTION | | DOWN_1 | DOWN_1 |
| | | | b2 ACID | b3 H2O1 |
| | MAIN | NEXT | UP | DOWN | ENTER |

FIG.12

| 6 | MIN INCREMENT (ml) | | 0.03 | 0.03 |
|---|---|---|---|---|
| | MAX INCREMENT (ml) | | 0.13 | 0.13 |
| | PRE-TITRE/GOAL | | 0.00 | 0.00 |
| | CALC FORMULA | | NORMAL | NORMAL |
| | UNITS | | % | % |
| | MIX CORR. | | 0.00 | 0.00 |
| | MAIN | NEXT | UP | DOWN | ENTER |

FIG.13

| SSR1/S:OPEN | SSR7/BUR 1 | RELAY 1 |
| SSR2/S:TAKE | SSR8/BUR 2 | RELAY 2 |
| SSR3/TRANS | SSR9/BUR 3 | RELAY 3 |
| SSR4/SPRAY | SSR10/BUR 4 | RELAY 4 |
| SSR5/STIR | SSR11/S1 | RELAY 5 |
| SSR6/CELL | SSR12/S2 | RELAY 6 |
| | | LEVEL 1111 |
| MAC/MAIN NEXT | UP DOWN | ENTER |

```
           SERVICE SCREEN 2

FLUSH BURETTE         1
  DISPENSE 0.000 ml FROM BURETTE 1
  TAKE SAMPLE           1
  SET ANALOG OUTPUT 1    TO      0.00 mA

MAIN      NEXT      UP      DOWN      ENTER
```

FIG.16

```
  18/8/98      12:00:00     4.550        28.97
  18/8/98      12:00:00     4.550        28.97
  18/8/98      12:00:00     4.550        28.97
  18/8/98      12:00:00     4.550        28.97
  18/8/98      12:00:00     4.550        28.97
                                1          2
  MAIN       NEXT       UP      DOWN      PRINT
```

FIG.17

```
CONC 1 ON 8/18/98

MAXIMUM    4.556
24h TWA    4.556
MINIMUM    4.556

MAIN    NEXT    BACK    FORWARD    DISPLAY
```

2: %
6.332                                     mL
MAIN    RUN    SINGLE
```

FIG.19

|  | VOLUME | pH/mV | GRADIENT |
|---|---|---|---|
| SELECT END 1> | 0.13 | 470 | 3.43 |
| SELECT END POINT | 0.22 | 600 | 12.09 |
| FOR OPTIMIZATION | 0.30 | 750 | 230.01 |
|  | 0.36 | 800 | 265.30 |
|  | 0.39 | 1100 | 8.45 |
| RETURN    UP    DOWN | | SELECT | ENTER |

FIG.26

REAL-TIME COMPONENT MONITORING AND REPLENISHMENT SYSTEM FOR MULTICOMPONENT FLUIDS

CROSS-REFERENCE TO RELATED APPLICATION

This application claims the priority of U.S. Provisional Patent Application No. 60/328,151 filed Oct. 8, 2001, in the name of Thomas Kloffenstein, et al. for "REAL-TIME MONITORING AND REPLENISHMENT OF SEMI-AQUEOUS PROCESS SOLUTIONS." Priority of said U.S. Provisional Patent Application No. 60/328,151 is hereby claimed under the provisions of 35 USC 119.

BACKGROUND OF THE INVENTION

1. Field of the Invention

The present invention relates generally to a real-time fluid monitoring and concentration control system for maintaining concentration of one or more selected species in multicomponent fluids at a desired level, e.g., in a range defining effective or optimal operation.

2. Description of the Related Art

In the field of semiconductor manufacturing, a number of multicomponent fluids are employed to carry out process operations, including etching, chemical mechanical planarization (CMP), photolithography, chemical vapor deposition, spin-on coatings application, supercritical fluids cleaning operations, wafer solvent drying operations, to name a few.

In many of these process steps, the relative concentrations or proportions of various components in the multicomponent process fluid must be maintained at a predetermined value or within a selected range, in order to achieve satisfactory results and avoid the necessity of rework or discarding of defective semiconductor device structures, including finished devices as well as precursor structures thereof.

By way of specific example, in semiconductor manufacturing operations of photolithography and etch processes, various solvents are employed for photoresist and post-etch residue removal.

Photoresist compositions are solvent-based, light-sensitive solutions, which are uniformly applied to a semiconductor wafer and then processed to leave a selected pattern of cured photoresist on the wafer after development. Etching then is carried out, wherein reactive gases or liquids are used to remove undesired material from the wafer surface, in the areas where the material is not protected by the cured photoresist.

During etching, various chemical complexes are formed or remain on horizontal and vertical surfaces of the structures being delineated. At the completion of the etch process, these complexes are no longer necessary and need to be removed, together with any remaining cured or uncured photoresist. This is typically accomplished using a mixture of fluids in gaseous, liquid or supercritical state or a combination thereof. Solvent mixtures used for the liquid removal of the cured photoresist and post-etch residues from the wafer include both acidic as well as basic solvent compositions.

The ability of the solvent chemistry to remove the cured photoresist and post-etch residues is strongly dependent on the ratios of its components. In addition, many solvent components require an elevated operating temperature to be effective. However, in solvent systems where water is a component, heating the solvent causes the water to evaporate. If not enough water is present in these solvent systems, then the solvent can become ineffective. Conversely, if too much water is present, damage may occur to exposed surfaces on the wafer. Therefore, an out-of-specification solvent mixture can result in severe damage to the wafers and/or a failure to remove undesired materials such as the photoresist or etch-generated residues.

In addition to process instability, significant costs can be incurred due to the limited lifetime of these solvent mixtures. These can variously include: costs of the chemicals; costs associated with equipment downtime reducing the production efficiency of the manufacturing facility; costs associated with an incremental and/or catastrophic yield loss due to device parametric failures of defective wafers resulting from use of out-of-specification chemicals, and disposal costs of the high volumes of required chemicals.

The problems attendant the use of out-of-specification multicomponent solvent compositions in removal of photoresist and post-etch residues are illustrative of the difficulties encountered in many industrial processes in which compositional uniformity of a multicomponent fluid composition is critical to meeting process objectives and commercial viability.

The foregoing provides a background to the advance of the present invention, as described more fully hereinafter.

SUMMARY OF THE INVENTION

The present invention relates in one aspect to a multicomponent fluid composition monitoring and compositional control system, in which a component analysis is effected by titration or other analytical procedure, for one or more components of interest, and a computational means then is employed to determine and responsively adjust the relative amount or proportion of the one or more components in the multicomponent fluid composition, in order to maintain a predetermined compositional character of the multicomponent fluid composition.

In a further specific aspect, the multicomponent fluid composition monitoring and compositional control system is utilized in a fluid-using processing facility, and arranged for real-time component analysis of the multicomponent fluid, with the computational means determining and responsively adjusting the relative amount or proportion of the component(s) in the multicomponent fluid composition, in real time, to maintain the predetermined compositional character of the multicomponent fluid composition in the fluid-using processing facility.

A further aspect of the invention relates to a fluid utilization and management system, comprising a fluid-using processing facility using a multicomponent fluid, and a fluid monitoring and concentration control system for maintaining concentration of one or more selected species in the multicomponent fluid at a desired level for use of the multicomponent fluid in the fluid-using processing facility, wherein the fluid monitoring and concentration control system comprises (i) an analyzer unit, constructed and arranged to monitor the concentration of one or more components of the multicomponent fluid using a real-time methodology, and (ii) a control unit constructed and arranged to compare the results of the analyzer unit to pre-programmed specifications and responsively control dispensing of the aforementioned one or more components into the multicomponent fluid as required to maintain a predetermined concentration of the aforementioned one or more components in the multicomponent fluid used in the fluid-using processing facility.

A further aspect of the invention relates to a system for generating hydrogen peroxide at a point of use comprising a hydrogen peroxide-using processing facility, such system comprising an electrochemical cell constructed and arranged for generating hydrogen peroxide, and a hydrogen peroxide monitoring and concentration control assembly including a Karl Fischer analysis unit comprising means for sampling fluid from the electrochemical cell and analyzing same by Karl Fischer analysis, wherein the hydrogen peroxide monitoring and concentration control assembly includes a source of titration agent for the Karl Fischer analysis, and means for real-time determination of concentration of the hydrogen peroxide based on the Karl Fischer analysis.

Yet another aspect of the invention relates to a system for generating hydroxylamine at a point of use comprising a hydroxylamine-using processing facility, such system comprising an electrochemical cell constructed and arranged for generating hydroxylamine, and a hydroxylamine monitoring and concentration control assembly including a Karl Fischer analysis unit comprising means for sampling fluid from the electrochemical cell and analyzing same by Karl Fischer analysis, wherein the hydroxylamine monitoring and concentration control assembly includes a source of titration agent for the Karl Fischer analysis, and means for real-time determination of concentration of the hydroxylamine based on the Karl Fischer analysis.

A still further aspect of the invention relates to a system for generating an active reagent selected from hydroxylamine and hydrazine at a point of use including a semiconductor manufacturing facility arranged for use of the active reagent, in which the system includes (i) means for electrochemical generation of the active reagent at the point of use, (ii) means for simultaneous real-time process monitoring of the concentration of these chemicals both in the electrochemical cell and at the point of use, such means (i) and (ii) including a Karl Fisher electrochemical cell platform for both the generation and monitoring of the active reagent.

In another aspect, the invention relates to a multicomponent fluid composition monitoring and compositional control system, including means for performing component analysis of the multicomponent fluid by titration or other analytical procedure, for one or more components of interest, and computational means constructed and arranged to determine and responsively adjust the relative amount or proportion of the one or more components in the multicomponent fluid composition, to maintain a predetermined compositional character of the multicomponent fluid composition.

In another aspect, the invention relates to a process of monitoring and compositionally controlling a multicomponent fluid used in a processing facility, such process including conducting a real-time component analysis of the multicomponent fluid by titration or other analytical procedure, for one or more components of interest, and computationally and responsively adjusting in real time the relative amount or proportion of the one or more components in the multicomponent fluid composition, to maintain a predetermined compositional character of the multicomponent fluid composition utilized in the fluid-using processing facility.

Another aspect of the invention relates to a fluid utilization and management process, including providing a fluid-using processing facility using a multicomponent fluid, and maintaining concentration of one or more selected species in the multicomponent fluid at a desired level for use of the multicomponent fluid in the fluid-using processing facility, by monitoring the concentration of one or more components of the multicomponent fluid using a real-time methodology, and comparing the results of the methodology to preestablished specifications and responsively controlling dispensing of said one or more components into the multicomponent fluid as required to maintain a predetermined concentration of the aforementioned one or more components in the multicomponent fluid used in the fluid-using processing facility.

In yet another aspect, the invention relates to a process for generating hydrogen peroxide at a point of use including a hydrogen peroxide-using processing facility, such process including generating hydrogen peroxide in an electrochemical cell, and monitoring hydrogen peroxide in a Karl Fischer analysis unit including sampling fluid from the electrochemical cell and analyzing same by Karl Fischer analysis, titrating hydrogen peroxide in the sampling fluid with titration agent in the Karl Fischer analysis, and determining in real time the concentration of the hydrogen peroxide based on the Karl Fischer analysis.

A further aspect of the invention relates to a process for generating hydroxylamine at a point of use including a hydroxylamine-using processing facility, such process including generating hydroxylamine in an electrochemical cell, and monitoring and controlling concentration of the hydroxylamine, including sampling fluid from the electrochemical cell and analyzing same by Karl Fischer analysis, wherein the hydroxylamine monitoring and concentration control steps include real-time determination of concentration of the hydroxylamine based on the Karl Fischer analysis.

Yet a further aspect of the invention relates to a process for generating an active reagent selected from hydroxylamine and hydrazine at a point of use including a semiconductor manufacturing facility arranged for use of the active reagent, such process including (i) electrochemically generating the active reagent at the point of use, (ii) simultaneously monitoring concentration of the active reagent in real time, both in the electrochemical cell and at the point of use, using a Karl Fisher electrochemical cell platform for both the generation and monitoring of the active reagent.

Another aspect of the invention relates to a multicomponent fluid composition monitoring and compositional control process, including performing component analysis of the multicomponent fluid by titration or other analytical procedure, for one or more components of interest, and computationally determining and responsively adjusting the relative amount or proportion of the one or more components in the multicomponent fluid composition, to maintain a predetermined compositional character of the multicomponent fluid composition.

Other aspects, features and embodiments of the invention will be more fully apparent from the ensuing disclosure and appended claims.

BRIEF DESCRIPTION OF THE DRAWINGS

FIG. 8 depicts a typical sequence section showing the use of the conditional IF, for the fluid component monitoring and concentration maintenance system.

FIG. 9 shows the Setup Screen 2, Analog Outputs and Relay Set Points, for the fluid component monitoring and concentration maintenance system.

FIG. 10 shows the Setup Screen 3, Calibration Data/Trigger, for the fluid component monitoring and concentration maintenance system.

FIG. 11 shows the Setup Screen 4, Analysis Timing, for the fluid component monitoring and concentration maintenance system.

FIG. 12 shows a screen representative of Setup Screens 5 and 7, Endpoint Parameters, for the fluid component monitoring and concentration maintenance system.

FIG. 13 shows a screen representative of Setup Screens 6 and 8, Analysis Control, for the fluid component monitoring and concentration maintenance system.

FIG. 16 shows Service Screen 2, for the fluid component monitoring and concentration maintenance system.

FIG. 17 shows the first Data Screen, for the fluid component monitoring and concentration maintenance system.

FIG. 18 shows the second Data Screen, for the fluid component monitoring and concentration maintenance system.

FIG. 19 shows the Run Screen, for the fluid component monitoring and concentration maintenance system.

FIG. 26 shows an Optimize Screen, allowing the selection of the endpoint with the greatest gradient (strongest point of inflection), and thus optimization of the endpoint and increments to invariably find this endpoint.

DETAILED DESCRIPTION OF THE INVENTION, AND PREFERRED EMBODIMENTS THEREOF

Figure 1:
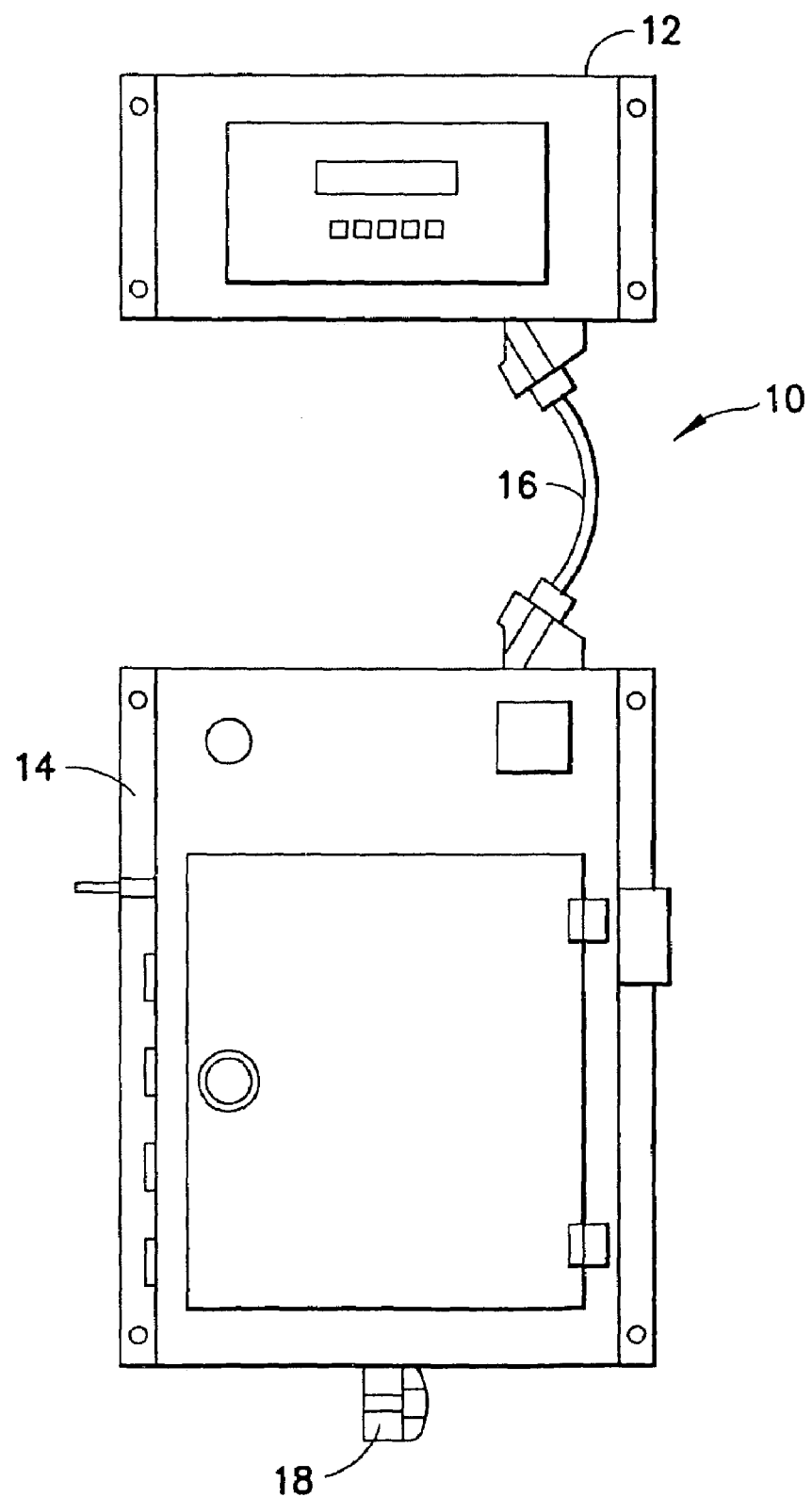
FIG. 1 is a schematic representation of a fluid component monitoring and concentration maintenance system according to one embodiment of the invention.

The present invention provides a multicomponent fluid monitoring and replenishment system for measuring one or more components of the multicomponent fluid, e.g., a solvent mixture, and providing correlative quantitative feedback for on-line chemistry control, to facilitate real-time correction of the composition and stable control of the fluid process.

Although described primarily and illustratively hereafter with reference to semiconductor manufacturing removal of photoresist and post-etch residue from semiconductor device structures by multicomponent solvent mixtures including water and organic solvent(s) forming a semi-aqueous solvent composition, the invention will be recognized as having broad applicability to a wide variety of multicomponent fluid operations, in which it is essential to maintain the compositional character of the multicomponent fluid composition at a specific value or within a specific range, in respect of the relative concentrations and proportions of components in the fluid composition. Thus, the invention may be employed in specific embodiments for monitoring and compositionally controlling non-aqueous fluid compositions.

Accordingly, the ensuing discussion will be directed illustratively to a solvent monitoring and replenishment system according to the invention, which has been found to be particularly suitable for controlling solvent processes such as photoresist and post-etch residue removal, in which maintenance of water concentration within specified limits is critical to the proper operation of the process.

The illustrative solvent monitoring and replenishment system of the invention in one embodiment thereof includes two primary components: (i) an analyzer unit, which monitors the concentration of the selected solvent mixture components using real-time methodology, e.g., a Karl-Fischer titration methodology, and (ii) a control unit which functions as the process controller. The control unit compares the results of the analyzer unit to pre-programmed specifications and controls the dispensing of one or more chemicals into the solvent process system as required to maintain a desired component ratio of solvent components. The solvent mixture in one embodiment of the invention is provided in one or more baths in the process system. In such case, the pre-programmed specifications preferably include volume of each bath being monitored, frequency of monitoring and a titration calculation factor for calibration. The monitoring and control operations are carried out in real time, i.e., the operations occur within a short period of time from the beginning of the monitoring process and there is no substantial time delay between the commencement of the sampling process and the control operation.

In one embodiment of the invention, the analyzer unit monitors the concentration of the water component of a sample using a classic Karl Fischer titration methodology. The analyzer unit in such embodiment incorporates a micro-size reaction vessel that requires as little as 5 ml of KF titration solvent for each test. While the titration is carried out in non-aqueous conditions, the KF solvent can contain trace amounts of water. In addition, water can originate from the methanol used to "shuttle" the sample as well as from the internal surface of the analyzer's fluidics system. This problem is solved by a technique of pre-titration of the solvents in the enclosed reaction vessel. These two "pre-dry" steps ensure maximum accuracy for the subsequent analysis. After titration solvent has been dried, a small amount of the sample (typically 1 ml) is extracted and its water content determined by Karl Fischer titration using a dual-platinum sensor to detect the titration end-point.

The process controller is used to accurately control the automatic replenishment of the solvent components, in particular water, guaranteeing optimum and stable processing over an extended period of time. Once the component analyzer determines the relative composition of the solvent system, the process controller can restore the system to the correct component ratio. Specific limits are pre-programmed into the process controller for the specific component(s) being targeted for analysis. The results from the component analyzer are compared to these specification limits and, if determined to be below the minimum specification value, amounts of the target component can be injected into the solvent solution to restore the required component ratio. By maintaining the component ratio of the solvent system within predetermined limits, the effective bath life of the solvent mixture can be extended.

In many amine-based, alkaline solvent mixtures, such as the ST-26S solvent mixture commercially available from ATMI, Inc. (Danbury, Conn.), water constitutes an active and necessary ingredient for the functioning of the solvent mixture. When the water content is reduced below a particular value, it renders the solvent incapable of performing the reactions required for photoresist and post-etch residue removal in the semiconductor manufacturing removal operation for which the solvent is intended.

At an operating temperature of 60° C., the water content of such ST-26S solvent mixture decreases from an initial value of ~16.5% to a final value of ~4.9% over 24 hours due to evaporation. When coupled to the solvent monitoring and replenishment system of the invention, the same solvent maintained a water content of ~16.5% for over 24 hours. By maintaining a consistent water concentration in the solvent mixture, the performance of the solvent will be stable over an extended period of time. Maintaining chemical concentrations of the solvent components of the solvent mixture at predetermined set-point levels maximizes a solvent mixture's useful life and thus minimizes production downtime due to re-pouring of solvents and re-qualification of those chemical mixtures. In addition, more stable solvent mixtures yield a more consistent process performance, resulting in higher yield through reduced failure rates.

The invention therefore provides in one embodiment a means and method of in situ monitoring and $H_2O$ injection of aqueous solvent mixtures used for the removal of bulk photoresists and post plasma etch/ash residues, which achieve an unexpected level of reduction, e.g., greater than 33%, and higher, of the overall consumption of semi-aqueous solvent cleaning solution in such semiconductor manufacturing operation.

The system and method of the invention are usefully applied to the maintenance of semi-aqueous solvent mixtures that are employed for wafer cleaning in semiconductor manufacturing applications. Approximately 75% of all of the solvents used for residue removal and photoresist "stripping" contain water. The recommended operating temperature for these solutions is between 45–75° C., and the typical bath life for these solutions is between 8–24 hours. The bath life is primarily determined by the loss of water due to evaporation. Using the concentration analysis and solvent replenishment system of the invention to analyze the solution and adjust the water level, the bath life can be increased by at least 100%. This results in substantial savings in a) chemicals, b) downtime for chemical changes, and c) chemical disposal costs. The invention thereby achieves a substantial advance in the art of cleaning semiconductor device structures.

Referring now to the drawings, FIG. 1 is a schematic representation of a fluid component monitoring and concentration maintenance system 10 according to one embodiment of the invention. FIG. 2B, described more fully hereinafter, is a schematic representation of the same system as mounted within a single cabinet, as a unitary system assembly, wherein the cabinet is fabricated of a chemically-resistant material, e.g., stainless steel, Teflon® polytetrafluoroethylene, or polypropylene.

The fluid component monitoring and concentration maintenance system 10 includes an Analytical Information Module 12. The Analytical Information Module includes the user interface, display, analysis control and data input/output functions for the system, and functions as the concentration analysis and controller unit of the apparatus. The Analytical Information Module also includes a Wet Chemistry Module 14 as the solvent replenishment unit of the apparatus.

The Analytical Information Module is mounted in a separate enclosure from the Wet Chemistry Module in the embodiment illustrated in FIG. 1. The Analytical Information Module is provided with external connectors for coupling the Analytical Information Module 12 to the Wet Chemistry Module 14, via an interface cable harness 16. User-accessible input/output terminals (not shown in FIG. 1) are provided at the upper portion of the Analytical Information Module 12, under an access hatch on top of the housing of such Analytical Information Module. The Analytical Information Module is most advantageously mounted above or to the side of the Wet Chemistry Module in the semiconductor manufacturing facility.

The Wet Chemistry Module 14 of the apparatus is constructed and arranged to perform highly accurate measurements and comprises:

a sampling system;
sensor(s);
a reaction vessel with mixer; and
a reagent dispensing system, each of which is described more fully below.

Sampling System

During analysis, the apparatus captures a small quantity of sample from a by-pass loop connected to the process stream of the semiconductor manufacturing operation. The process stream comprises the cleaning solvent mixture that is used to remove unwanted material from a wafer structure, e.g., a semiconductor device or semiconductor device precursor structure on which material has been deposited, or is otherwise present.

Once isolated, the solvent mixture sample is transferred to the reaction vessel using a suitable solvent. After sample has been transferred to the reaction vessel and analyzed, the reaction vessel is rinsed with solvent to minimize the analyzer's exposure to aggressive process chemistry that may alter or otherwise adversely affect its operation in prolonged exposure.

The materials of construction of the sample system are appropriately selected for optimal use in a clean-room environment. The sample system is designed to ensure reliable isolation between the process and the fluid component monitoring and concentration maintenance system, so as to minimize the possibility of process contamination. The sample system drain 18 (see FIG. 1) is most advantageously located below the reaction vessel.

Sensors

One or more sensors is/are used by the fluid component monitoring and concentration maintenance system to plot each analysis curve, or for direct measurement of the sample.

Reaction Vessel

The micro-volume reaction vessel of the fluid component monitoring and concentration maintenance system is constructed of a suitable solvent-resistant material of construction. A preferred material of such type is TPX engineering plastic, which is transparent yet remains highly resistant to a wide variety of solvents.

The reaction vessel in one embodiment of the invention includes an integral mixing system, comprising a solid-state magnetic stirrer and Teflon-coated stir bar, plus ports for up to two standard 12 mm pH, oxidation-reduction potential (ORP) or ion selective electrodes. The reaction vessel in such embodiment also accommodates dual-platinum electrodes for following the Karl Fischer reaction. This reaction vessel is sized and arranged to accommodate one transfer solvent and up to three further analytical reagents (e.g. titrant, cleaning solvent, etc.).

Reagent Dispensing System

The fluid component monitoring and concentration maintenance system comprises a reagent dispensing system that in the illustrative embodiment includes precision glass burettes, with digital linear actuator control, to provide a highly accurate reagent dispensing capability. Each burette in such embodiment has a capacity of 5 ml/stroke, gives a resolution of 0.01 ml, and is capable of theoretical accuracy of ±0.0015 ml.

In view of the deficiency of conventional syringe-pumps as susceptible to damage caused by reagent leakage, the fluid component monitoring and concentration maintenance system in the reagent dispensing system uses an "inverted burette" design. Each burette incorporates a solvent-resistant O-ring seal, e.g., a Kalrez™ O-ring seal providing an operational life of at least 3 months.

The fluid component monitoring and concentration maintenance system in one embodiment is designed for double containment of both the analyzer and the reagents, accommodating the sample inlet/outlet lines, the reagent lines, and the drain lines. The compressed air supply in such arrangement is not double contained. The reagent enclosure also affords double containment of the reagent lines.

The fluid component monitoring and concentration maintenance system is preferably provided in a modular form to give a greater degree of flexibility in locating the apparatus in the semiconductor manufacturing facility. For example, the Wet Chemistry Module, Analytical Information Module and reagents can be located inside the associated process tool, in a service chase adjacent to the process, or in the sub-fab area of the semiconductor manufacturing plant, as may be necessary or desirable in a given application of the present invention. Preferably, the Wet Chemistry Module is located near the tool's pumps, piping and drain, and the Analytical Information Module is mounted in a convenient and accessible location either above or next to the Wet Chemistry Module.

Installation of the fluid component monitoring and concentration maintenance system can be effected on either a recirculating bath/process or a non-recirculating bath/process, as described more fully hereinafter.

The fluid component monitoring and concentration maintenance system may optionally include a parallel display unit providing the same functions as the Analytical Information Module, which is remotely mountable from the Analytical Information Module and the Wet Chemistry Module in the semiconductor manufacturing facility, such as at a convenient location in the cleanroom. This arrangement allows for a display unit of the Analytic Information System to be positioned at its point of use in the semiconductor manufacturing facility, e.g., for servicing and troubleshooting the analyzer, while the remotely situated parallel display unit allows the operator to manipulate the Analytical Information Module from inside a cleanroom.

As an alternative to the use of double containment for reagents, the fluid component monitoring and concentration maintenance system may include a reagent enclosure designed to contain an excess of the volume of all possible reagents, e.g., the reagent enclosure may be sized and arranged to accommodate 110% of all possible reagents. Such reagent enclosure is fabricated of any suitable chemically compatible material(s) of construction.

The reagent enclosure (if provided) can be mounted below the Wet Chemistry Module. The reagent enclosure can also be mounted to the left or right of the Wet Chemistry Module, but it desirably is not mounted above the Wet Chemistry Module, so as to eliminate the possibility of a siphon effect. When mounting the reagent enclosure, sufficient clearance should be maintained between the Wet Chemistry Module and the reagent enclosure, in order to access the Wet Chemistry Module drain and valve.

Figure 2A:
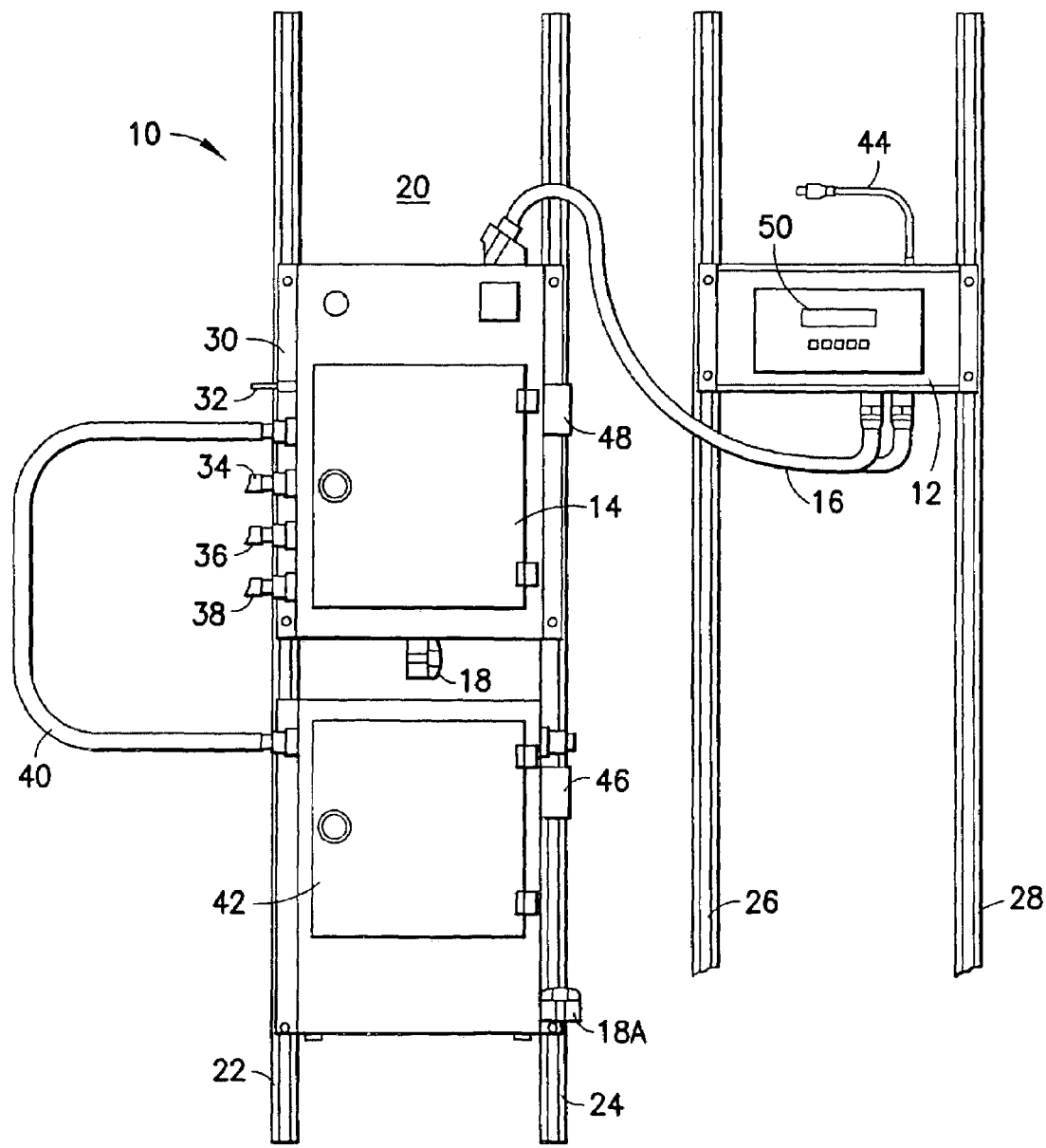
FIG. 2A is a schematic representation of the fluid component monitoring and concentration maintenance system of FIG. 1, as wall-mounted in a semiconductor manufacturing facility utilizing wall mounting brackets.
Figure 2B:
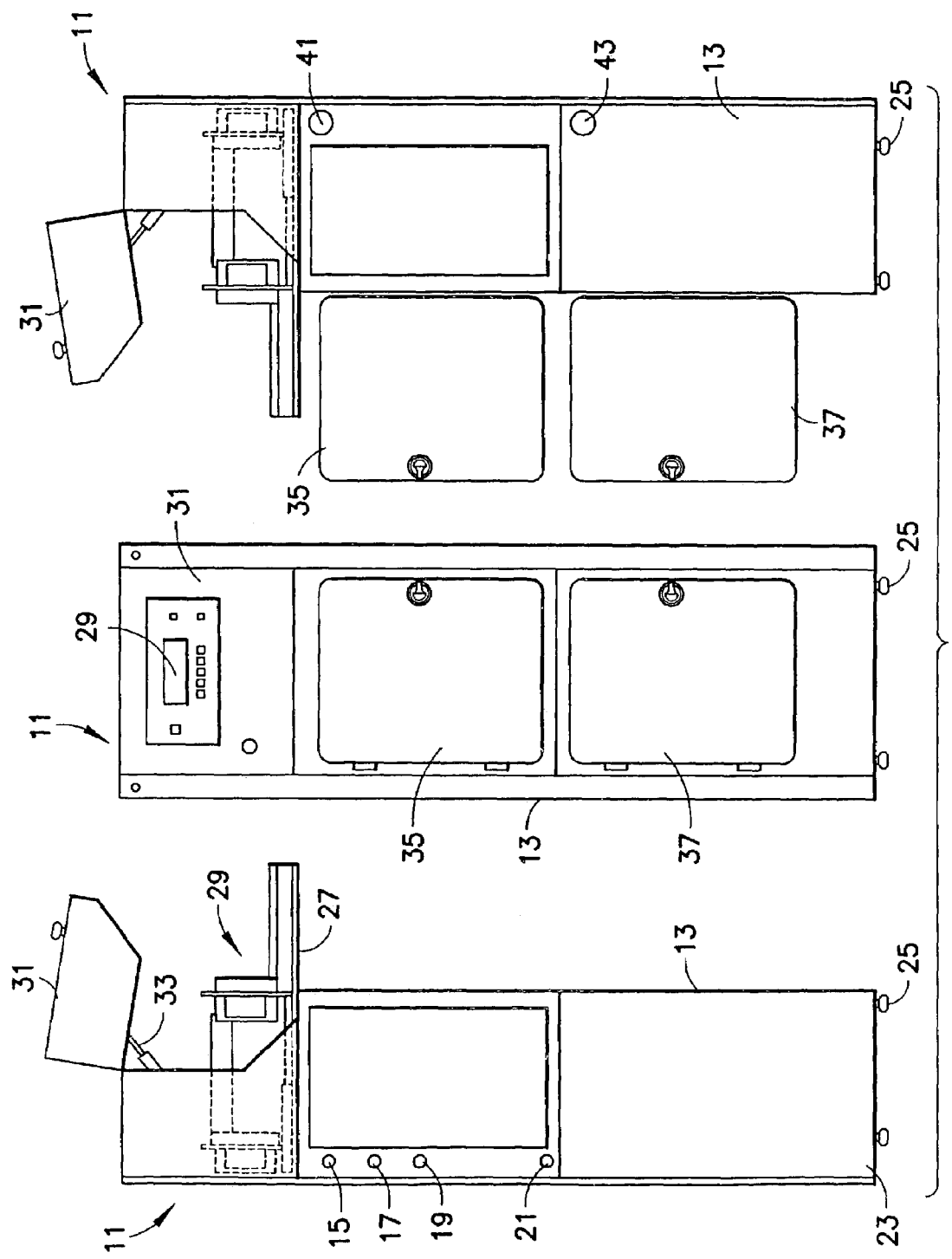
FIG. 2B is a schematic representation of a fluid component monitoring and concentration maintenance system according to a second embodiment of the invention utilizing a single, self-contained cabinet for mounting the system, in which the cabinet optionally may be equipped with wheels to facilitate relocation as a mobile system within a semiconductor manufacturing facility or alternatively the cabinet may be fabricated without wheels to provide a semi-permanent installed system that is fixedly positioned in the semiconductor manufacturing facility.

The fluid component monitoring and concentration maintenance system 10 is shown in FIG. 2A as wall-mounted on wall 20 in a semiconductor manufacturing facility, utilizing "UNI-STRUT" or other wall mounting brackets 22, 24, 26 and 28. As mentioned hereinabove, the fluid component monitoring and concentration maintenance system 10 may also be integrated into a process tool when the process tool contains sufficient space for such integrated deployment of the fluid component monitoring and concentration maintenance system.

The fluid component monitoring and concentration maintenance system 10 as shown in FIG. 2A includes a sample system, sensor(s) and mixed reaction vessel in the upper housing 30 of the Wet Chemistry Module 14. The upper housing as shown is coupled with a compressed air line 32, a sampling system including sample #1 inlet/return 34, and sample #2 inlet/return 36, drain 38, and exhaust port 48. The double containment reagents line 40 interconnects the upper housing 30 with the lower housing 42 containing reagent supply means (not shown). The lower housing 42 is provided with an enclosure drain 18A, and exhaust 46.

Mounted on brackets 26 and 28 adjacent to the Wet Chemistry Module 14 is the Analytical Information Module 12 including computational means, such as a programmable general purpose electronic computer, microprocessor, central processor unit (CPU), or other suitable means, coupled to display 50 for visual observation of the output of the Module 14. The Analytical Information Module 14 is equipped with a power cord 44, for plug-in to a plug receptacle of an electrical power system, for powering of the computational means and other means disposed in the housing of the Analytical Information Module 14.

Figure 3:
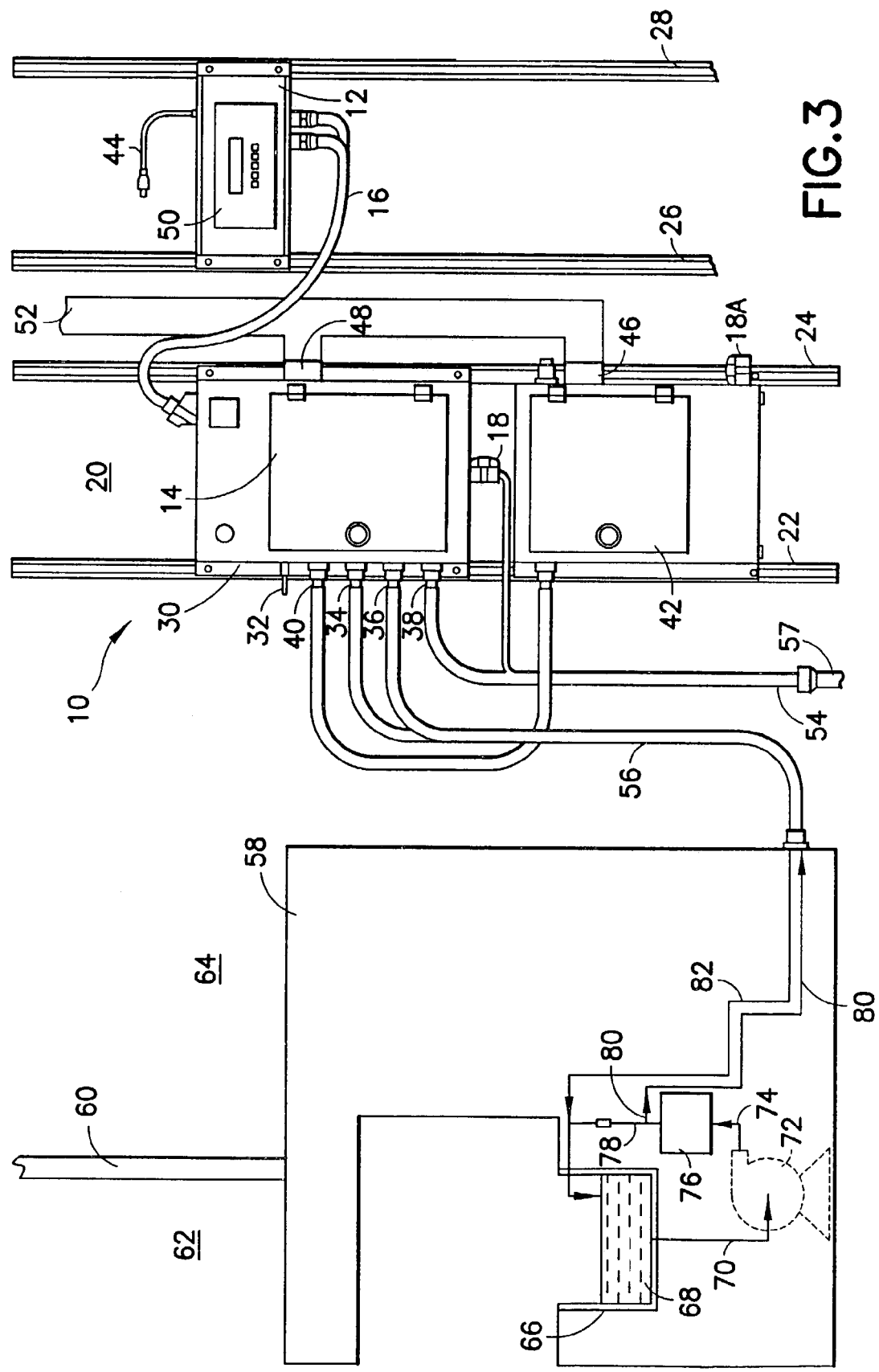
FIG. 3 shows an illustrative arrangement of the fluid component monitoring and concentration maintenance system with a fast loop recirculating bath arrangement utilizing the wall-mounted embodiment of the invention.

The fluid component monitoring and concentration maintenance system 10 is preferably arranged to sample the process solvent mixture from a bath 68 in tank 66, equipped with a recirculating pump 72, as is shown for example in FIG. 3. In such recirculating bath arrangement, a proportion of the sample is bled from the recirculation system in sample feed line 80 and fed by feed/return line 56 to the fluid component monitoring and concentration maintenance system 10. The sample enters the sample panel of the fluid component monitoring and concentration maintenance system 10, passes briefly through its 3/2-way sample valve, and then returns to the process tool 58.

The process tool 58 is disposed in relation to wall 60 demarcating a boundary between cleanroom 62 and service chase 64, as illustrated. The tank 66 containing bath 68 is coupled with a fluid feed line 70 to the pump 72, from which the fluid is flowed in discharge line 74 though filter 76 to recirculation line 78 for return to the bath 68.

Sampled fluid is returned from fluid component monitoring and concentration maintenance system 10 in feed/return line 56 from return 36, and passes in sample return line 82 to join with the fluid recirculated in recirculation line 78 for return to the bath 68. A portion of the fluid from the bath in recirculation line 78 is diverted in sample feed line 82 to the feed/return line 56 from which it flows in the branched portion thereof to feed inlet 34.

The drains 38 and 18 from the Wet Chemistry Module 14 convergently join in drain line 54, which is connected in turn to floor drain 57. The exhausts of the upper and lower housings 30 and 42 are coupled in closed flow communication with the exhaust conduit 52, for fluid discharge of exhaust from the system.

This "fast loop" concept minimizes chemical wastage and the possibility of process contamination, and lessens the criticality of the distance between process and the fluid component monitoring and concentration maintenance system, as a consequence of the zero dead-volume of the fast loop arrangement.

FIG. 2B is a schematic representation of a fluid component monitoring and concentration maintenance system 11 according to a second embodiment of the invention utilizing a single, self-contained cabinet 13 for mounting the system, in which the cabinet optionally may be equipped with wheels 25 to facilitate relocation as a mobile system within a semiconductor manufacturing facility or alternatively the cabinet may be fabricated without wheels to provide a semi-permanent installed system that is fixedly positioned in the semiconductor manufacturing facility.

FIG. 2B shows the fluid component monitoring and concentration maintenance system 11 in respective left-hand side elevation, front elevation and right-hand side elevation views, as viewed from left to right in the drawing figure.

The left-hand side elevation view shows the unitary cabinet 13 as including an upper housing member 31 that is arranged to be swingably openable and closeable by means of the damped strut connector 33. The upper portion of the housing includes a slidable tray 27 on which is provided a display 29 which may comprise a monitor that is coupled with a keyboard and CPU mounted on the tray, for access to the programmable Analytical Information Module embodied in the upper portion of the cabinet assembly.

The left-hand side elevation view of the unitary cabinet 13 as including a clean dry air (CDA) port 15, a sample #1 inlet and return port 17, a sample #2 inlet and return port 19, and enclosure drains 21 and 23. The wheels 25 are of any suitable type, e.g., castor or roller types, and enable to system to be portably relocated in the semiconductor processing facility. In lieu of providing the system shown in FIG. 2B as a mobile assembly, the system may be deployed without wheels, to constitute a stationary unit that is fixed positioned in the semiconductor manufacturing facility.

The front elevation view of the system 11 shown in the central view of FIG. 2B shows the cabinet doors 35 and 37 that permit access to the componentry of the Wet Chemistry Module.

The right-hand side elevation view shown in the right-hand portion of FIG. 2B depicts the unit in a mirror-image relationship to the view of the system unit illustrated in the left-hand portion of the FIG. 2B drawing, and shows the exhaust ports 41 and 43 of the Wet Chemistry Module.

FIG. 3 shows an illustrative arrangement of the fluid component monitoring and concentration maintenance system 10 with a fast loop recirculating bath arrangement. The fluid component monitoring and concentration maintenance system 10 as discussed is located in a service chase adjacent to the process tool, and all fluid lines are double contained, with a fluid drain free-flowing with zero back-pressure. Flow of fluid through the recirculation fast loop depends on there being sufficient pressure drop across the loop, which may necessitate restriction or adjustment of the flow through the main recirculation system, as appropriate.

Figure 4:
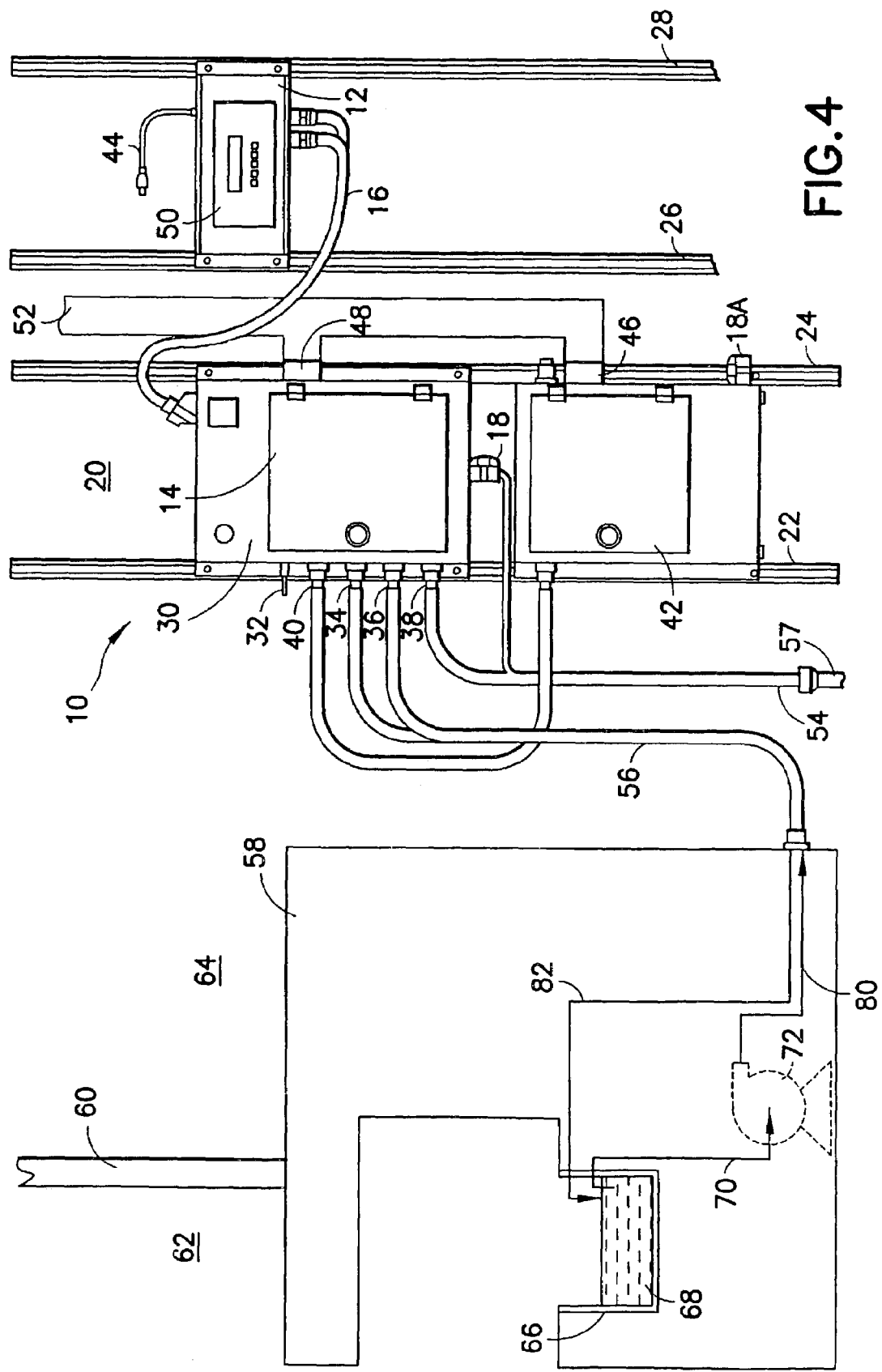
FIG. 4 shows an illustrative arrangement of the fluid component monitoring and concentration maintenance system deployed in a non-recirculating bath configuration.

Alternatively, the fluid component monitoring and concentration maintenance system 10 may be deployed in a non-recirculating bath configuration, as shown in FIG. 4, wherein all parts and components are labeled for consistency and ease of description, correspondingly as in FIG. 3. In this arrangement, sampling from the non-recirculating bath 68 in tank 66 involves sample being withdrawn from the top of the bath by a sampling pump 72, e.g., a pneumatic diaphragm-type pump, for flow of fluid from the bath 68 to pump feed line 70, and from pump 72 in sample feed line 80 to the feed/return line 56 from which it flows in the branched portion thereof to feed inlet 34. The sample return fluid flows from system 10 in feed/return line 56 from return 36, and passes in sample return line 82 to the bath 68.

In the non-recirculating bath configuration, the fluid component monitoring and concentration maintenance system 10 can be located in the fab or in an adjacent service chase. There is a greater possibility of entraining air in the sampling line in the non-recirculating bath configuration than in the recirculating bath mode, particularly when the bath is being drained. It therefore is preferred to locate the tip of the sample extraction pipe as close as possible to the bottom of the bath in the non-recirculating bath configuration.

The fluid component monitoring and concentration maintenance system 10 preferably is provided with suitable valving (not shown) to allow the fluid component monitoring and concentration maintenance system to be isolated from the associated process using the solvent mixture being monitored by the apparatus. Such valving may include automatic "fail closed" isolation valves, which close if there is an interlock violation. Corresponding valves or check-valves preferably are mounted in the sample return lines to eliminate the chance of back-flow from the process in the event of a leak.

The Wet Chemistry Module includes four 5 ml burette glasses mounted on burette guide-posts. Tubing connects the respective reagent bottles with the burette glasses in the Wet Chemistry Module.

Figure 5:
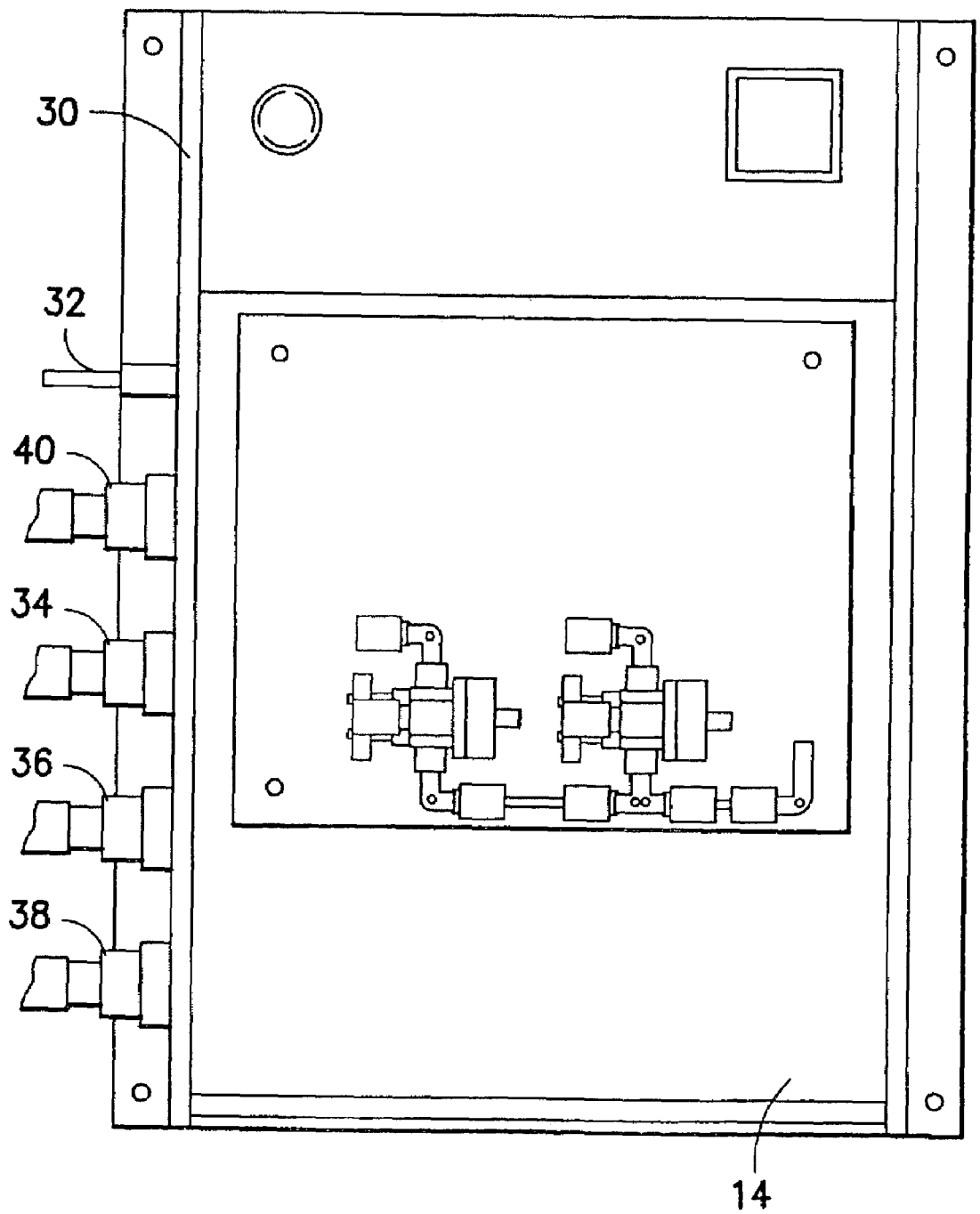
FIG. 5 shows the Wet Chemistry Module with respective fluid lines.

FIG. 5 shows the Wet Chemistry Module 14 with the respective fluid lines, including compressed air line 32, a sampling system including sample #1 inlet/return 34, and sample #2 inlet/return 36, and drain 38. The reagent lines are fed through double containment tubing of reagents line 40 to the reagent enclosure. An air source (of clean dry air (CDA)) is connected outside the Wet Chemistry Module by an appropriate coupling, e.g., a ¼" OD Flare-tek™ fitting on line 32. The sample(s) inlet 34 and return 36 are connected at the sample valves by appropriate couplings, which may also comprise ¼" OD Flare-tek™ fittings. The drain 38 is connected to the reaction vessel, and may for example comprise 3×⅛" tubes.

The fluid component monitoring and concentration maintenance system 10 in one embodiment is constructed and arranged to monitor the concentration of water in a conventional n-methyl pyrrolidone (NMP)-based photoresist stripping solvent. The apparatus may be configured to allow multiple, e.g., two or more, process streams to be independently analyzed.

The water content of the sample is measured by a suitable analytical technique, e.g., Karl Fischer titration, following an analyzer pre-dry phase, in which the endpoint is detected using a double-platinum electrode pair driven by a constant current module.

The fluid component monitoring and concentration maintenance system 10 may thus be arranged to perform a water in NMP analysis to determine sample water content by classical Karl Fischer titration technique, performed in non-aqueous conditions. The titration reaction requires three components: sulfur dioxide, iodine and water. The sulfur dioxide is readily oxidized with iodine—but only in the presence of water. A simple representation of the chemistry is $$SO_2 + I_2 + 2H_2O = H_2SO_4 + 2HI.$$

The sulfur dioxide and iodine, along with supporting solvents, are combined in commercially available Karl Fischer titrant/solvent packages such as those commercially available under the Hydranal trademark.

In the sample titration, the sample is titrated against the Karl Fischer titrant until any water contained in the sample has been completely consumed. Once all the water has been removed, a sharp endpoint is detected using a polarized (constant current) double-platinum electrode.

The detection of the endpoint in the Karl Fischer titration is accomplished by amperometric detection. Amperometry relies on the measurement of an electric current flowing between two polarized electrodes. The current flow is controlled by reactions taking place at the electrodes (not by the conductivity of the solution). These electrode reactions are:

at the cathode $I_2 + 2e \rightarrow 2I^-$, and at the anode $2I^- - 2e \rightarrow I_2$.

Before the endpoint of the titration, there is enough iodide present from the reaction of the Karl Fischer reagent with the sample water, so that there is no obstacle for the anode indicator reaction to proceed. However, no iodine is available for the cathode reaction, and this absence limits current flow between the electrodes. Only at and after the endpoint are iodine and iodide both present. Current then flows and the potential between the polarized indicator electrode drops to give an exceptionally sharp endpoint signal.

A very small (few micro-amp) current is imposed between the two platinum indicator electrodes. The fluid component monitoring and concentration maintenance system optionally may be provided with an integral constant-current supply, which powers the platinum indicator electrodes.

The Karl Fischer titration is carried out under "non-aqueous" conditions, but in a typical two-component Karl Fischer reagent set, the solvent usually contains considerable amounts of water. Further water contamination can come from the internal surfaces of the analyzer's fluidics system that come into contact with the sample, as well as water contamination deriving from atmospheric moisture.

The problem of obtaining a state of system dryness is solved in the fluid component monitoring and concentration maintenance system of the invention by a technique of pre-titration of the Karl Fischer solvent, plus the use of completely enclosed titration equipment with minimal unfilled volume. Thus the solvent used to transfer the sample to the titration vessel is first dried in a pre-titration step, using the Karl Fischer titrant itself. This dried solvent can then be used to flush out the sample transfer lines again prior to the sample capture step, where it again can pick up water necessitating a further pre-titration to dryness. Usually only two such "shuttle" drying steps are required, but it will be recognized that greater or lesser numbers of drying steps may be necessary or desirable in a given application of the invention.

In the assembly of burettes provided in the fluid component monitoring and concentration maintenance system of the invention, the role of each burette is as follows:

Burette 1—Karl Fischer solvent K (solvent for water determination in ketones);

Burette 2—methanol (optional flushing agent); and

Burette 3—Karl Fischer titrant K, 5 mg/ml (titrant for water determination in ketones).

The burettes are primed with reagent in a flushing procedure, carried out by the following sequence of steps:

Step 1. Power up the analyzer.

Step 2. Have each of the reagents ready in appropriate reagent bottles (e.g., the original chemical manufacturer's bottles).

Step 3. Unravel the burette inlet lines. Take a first reagent line (reagent line #1) and feed it through the reagent bottle cap, and slip the end of the tube over a tube weight barb.

Step 4. Drop the end of the tube, with its tube weight, into the selected reagent bottle, and secure the cap.

Step 5. Repeat the above Steps 1–4 for the second and third reagent lines (reagent lines #2 and 3).

Step 6. From the Sign-on Screen of the Analytical Information Module (described hereinafter in greater detail), press [SERVICE], then [NEXT]. Press [ENTER], and the number after "Flush Burette" will be underlined by a flashing cursor.

Step 7. Using the [UP] or [DOWN] keys, select the number of the burette desired to be flushed, then press [ENTER].

Following such steps, the burette will begin a standard flushing routine; the burette's piston will cycle up and down three times, during which any air and excess reagent will be expelled into the reaction vessel. At the end of the cycle, the burette should be full. If not, the routine is performed again, and the procedure is repeated for the other burettes until each is completely flushed. It is to be appreciated that Karl Fischer K reagents are unusually viscous, and may require additional flushing.

The Analytical Information Module is programmatically arranged with software in a computational unit for operating the system. The computer controlled fluid component monitoring and concentration maintenance system will now be described with reference to the software operation, and appertaining screen displays.

The Setup Screens displayed on the visual output display of the Analytical Information Module contain parameters that the fluid component monitoring and concentration maintenance system will use in its operation. These parameters allow the fluid component monitoring and concentration maintenance system to run a specific analysis sequence, find the endpoint(s), calculate and report the results.

The Calibration Screens are live read-outs of the electrode signals. Although the Karl Fischer electrode pair does not require routine calibration, these screens are still useful for troubleshooting the electronics and the chemistry.

The Service Screens allow manipulation of the system. Service Screen 1 allows the operator to force open any valve or relay. Service Screen 2 allows the operator to flush the burettes, set the analog outputs, and perform additional troubleshooting operations. The Data Screens allow the operator to review the stored analysis data. This data can be displayed either numerically or graphically. The Data Screen also allows the operator to download the data to a host computer for import into a spreadsheet program. The Run Screen allows the operator to place the Analytical Information Module into a single run or multiple runs operation. This screen is displayed at all times during analysis.

The various screens associated with the operation of the fluid component monitoring and concentration maintenance system will now be described, as associated with an illustrative embodiment of the invention.

Figure 6:
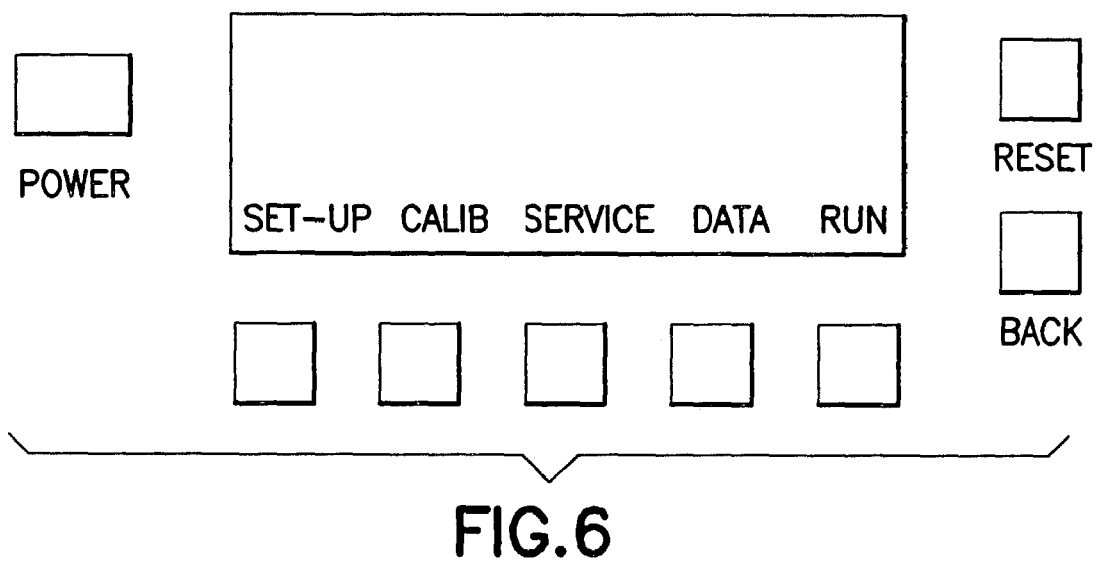
FIG. 6 depicts the Sign-On Screen that appears when the fluid component monitoring and concentration maintenance system is turned on or after reset.

The Sign-On Screen is shown in FIG. 6, and is the first screen to appear when the fluid component monitoring and concentration maintenance system is turned on or after reset. From this screen all the features of the operating software can be accessed.

The fluid component monitoring and concentration maintenance system in one embodiment is operated through "softkeys." Data also is enterable by the softkeys. The operation of the fluid component monitoring and concentration maintenance system is simplified by having a minimum number of keys. In the preferred arrangement of the system, only the keys needed to perform a function for the displayed screen are active.

Many modes accessible from the Sign-on Screen are actually made up of several screens linked together. The "softkeys" are, however, always clearly labeled and allow an unambiguous and simple use of the many functions available.

The fluid component monitoring and concentration maintenance system preferably is passcode-protected, whereby all parameters can be protected from unauthorized programming. The passcode entry routine is initiated by pressing the [SETUP] key for at least 2 seconds, and entering the passcode as instructed in the prompt line.

The fluid component monitoring and concentration maintenance system is arranged in one embodiment so that the first time the apparatus is connected to a main power source, the passcode "111111" is announced, and opportunity is afforded to customize the passcode. Any passcode other than the original "111111" will not be displayed, therefore the passcode remains a secret. If the programming mode has not been entered with the passcode, viewing of all screens is still possible, but the cursor and the keys [UP], [DOWN], and [ENTER] which are necessary for programming the fluid component monitoring and concentration maintenance system do not appear.

The programming mode is cancelled in the Sign-on Screen when any button is pressed for more than two seconds.

In the programming mode, the [SETUP] key has a double function. A short press transfers the operator to the screen for inspection of the data only. No programming is allowed. If, however, the [SETUP] key is pressed for longer than two seconds, the passcode input routine is accessed. On successful input of the passcode, full programming is possible in the fluid component monitoring and concentration maintenance system Setup Screens.

In such embodiment, the programming can be carried out by individual parameters or by loading the default values. The default values are loaded by pressing [CONTINUE] for longer than two seconds. Otherwise, the data values remain intact until programmed to another value individually.

If a reset occurs during the RUN mode, upon restarting, the fluid component monitoring and concentration maintenance system will return to the Sign-on Screen and remain idle until further instructions are given. The Analytical Information Module cannot be placed into any mode until the cause of the reset is corrected (such as an open door).

The ensuing discussion is directed to programming of the Analytical Information Module of the fluid component monitoring and concentration maintenance system.

In the programming mode, the [UP] or [DOWN] keys are used to move to the line required. The [ENTER] key is depressed, and the [UP] or [DOWN] keys are utilized to change the currently selected units. Pressing [ENTER] accepts the currently indicated data and moves the cursor to the next data field for input of that information. This process is repeated until all the data are entered. The cursor will return to the beginning of the line where the following steps are possible:

Re-entering the data by selecting this parameter with [ENTER],
Moving the cursor with [UP] or [DOWN] to another parameter on the screen,
Returning to the Sign-on Screen with [MAIN], and
Accessing the next Setup Screen with [NEXT].

Concerning the sequence parameters, all times preferably are in decimal minutes (e.g., 0.3 minute (=18 seconds)), all volumes are in milliliters, and the burettes are numbered 1–4 from left to right.

Figure 7:
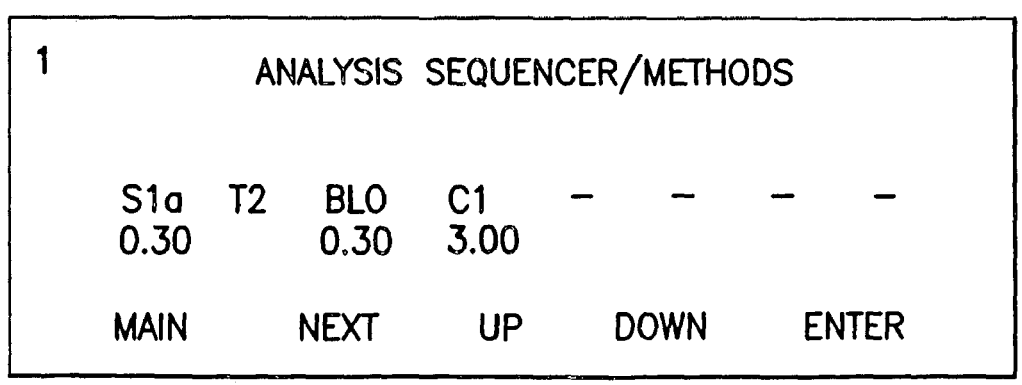
FIG. 7 depicts the Setup Screen 1, Analyzer Sequencer/Methods for the fluid component monitoring and concentration maintenance system.

The Setup Screen 1, Analyzer Sequencer/Methods, is shown in FIG. 7. The analyzer sequencer/methods screens allow the analysis routine to be defined. The FIG. 7 screen shows a routine that allows the fluid component monitoring and concentration maintenance system to take a sample (for 0.3 minute, or 18 seconds), titrate the sample with titrant from burette 2, empty the reaction vessel, and lastly re-fill the reaction vessel with methanol from burette 1.

In one embodiment, the Setup Screen 1 offers up to 32 steps, allowing customization of the function of the fluid component monitoring and concentration maintenance system. The available commands are:

MS—Measure and Set
Not required in the Water-in-NMP application.
BUR—Burette
Causes the selected burette to "draw back" a specified amount of reagent from the burette's tip. This feature is useful for eliminating the possibility of reagent leakage contaminating a particular step in the analysis sequence. The syntax is:

BUR
burette#
volume

M1–M5—MACRO Command

The MACRO commands, M1 through M5, allow custom valve sequences to be introduced into the analysis scheme.

IF, FI—Logical Branch

The conditional IF command allows a section of the programmed sequence to be performed only when the given condition is satisfied. The section subject to the IF condition is defined between the IF command and the FI command. The syntax is:

IF
Condition
Value

The available tests are:

pH>, pH<, mV>, mV< . . . Tests based on sensor output
ml>, ml< . . . Tests based on endpoint volume
x . . . A test based on number of elapsed cycles
Q2>, Q2< . . . Tests based on the signal being fed into the specified level sensor (useful for remote stream or method selection).

A typical sequence section showing the use of IF . . . FI is shown in FIG. 8

In this example, the IF branch will be carried out only when the previous titre was less than 0.50 mL. In this case, the titration will be repeated using burette 2 (where presumably a more dilute reagent is stored). The titrate command in the IF loop is assigned the R tag to indicate that it is not a determination on a new sample but a repeat of the previous. The second data field indicates the degree of dilution or concentration of the reagent over that used for the first titration.

A Ramp (RMP) command may be employed to automate validation experiments common during analyzer startup and method development. The RMP command functions like a C command, but adds reagent (usually a standard or sample) from the specified burette to the reaction vessel in amounts that increase by the specified volume with each cycle. The syntax is:

RMP
burette#
volume increment

When the RMP command is used, a complete set of titration curve data is automatically outputted via the RS232 interface after each analysis.

The Blow (BLO) command is used as an "accelerated vessel empty" command to initiate use of CDA to blow the contents of the reaction vessel to the drain. The syntax is:

BLO
Time

The Shuttle (STL) command follows the Td command, manipulating the burette 1 to withdraw up to 5 mL of the reaction vessel's contents and then force it back into the titration vessel again. After the shuttling is completed, a further "polish" dry-down of the solvent is automatically performed. This sequence is designed to ensure a thoroughly dried sampling and analysis system prior to introduction of the sample. The syntax is:

STL
burette#
volume

The Else branch (ELS) command is used with an IF . . . FI loop; when the IF condition is not met, then whatever follows the ELS command is performed.

The S1w or S2w commands (Sample from stream 1 or stream 2 prior to Karl Fischer (water) titration) trigger the preprogrammed sampling sequence in preparation for titration of water in the sample. The time is that allowed for purging the sample loop. The syntax is:

S1w
Time

The Tw1 (Titrate water using method 1) command calls for the titration of water in the sample, using the "method 1" parameters. The titration parameters are defined in column "B3H2O 1" in Setup Screens 5 and 6.

The Tw2 (Titrate water using method 2) command calls for the titration of water in the sample, using the "method 2" parameters. The titration parameters are defined in column "B3H2O 2" in Setup Screens 7 and 8.

The Td (Titrate to dryness) command dries the Karl Fischer solvent prior to capturing the sample. This command typically precedes the STL command. The titration parameters are defined in column "B3 dry" in Setup Screens 7 and 8.

The C1–C4 (Condition with reagent 1–4) command calls for a defined volume of reagent to be dispensed into the reaction vessel from the specified burette. The syntax is:

C1
volume

The W (Wait) command causes the analyzer to pause at this point for the defined length of time. This command is typically used to allow a sensor to stabilize prior to beginning a titration. The stirrer operates throughout this time. The syntax is:

W
Time

Setup Screen 2, Analog Outputs and Relay Set Points, is shown in FIG. 9. In Setup Screen 2 the analog outputs and the relay functions are set.

The fluid component monitoring and concentration maintenance system has up to four analog outputs. The analog outputs are standard 4 . . . 20 mA configuration. The assignment of the outputs is given in the text input in the left data field. An output value of 4 mA always represents a result (concentration) of zero. The concentration corresponding to the end of the range may be programmed freely, within the constraints of the input data format: 0.01 to 9999.99 in the right data field. For instance, if a typical concentration is usually around 6%, the analog outputs can be advantageously set to be 0 to 10%, so that the normal operating range is in the middle of the analog output range.

In the Relay Assignments, the four/six alarm relays can be assigned the following functions:

1>, 1<, 2<, 2> . . . relay closes if specified result is less than or greater than the specified value
err . . . relay closes if any error condition is detected
off . . . relay is disabled
Q2, Q3, Q4 . . . relay closes if the specified level sensor is activated The above assignments are made in the first field of the relay set up line. The sample concentration that triggers an alarm is set in the data fields to the right. The data is in decimal format. If a relay has been assigned to a level sensor, then the concentration data field is irrelevant.

The Setup Screen 3, Calibration Data/Trigger, is shown in FIG. 10. This Setup Screen allows for process or factor calibration data to be entered, which are used to convert the volume (ml) of titrant used to reach the endpoint into units of concentration (e.g. wt %).

The fluid component monitoring and concentration maintenance system can manipulate the endpoint volume (or "titre") in one of two ways:

in a first approach, the analyzer's "factor" is calculated from first principles, taking into account sample size, reagent concentration, reaction stoichiometry and required result units; and in a second approach of "process calibration," the analyzer is synchronized with a trusted laboratory analysis result.

The parameter "calibration type" is used to define whether the calculation of the concentrations is conducted according to classical titration rules of balancing chemical equivalents (factor) or using a parameter that has been determined from a process calibration (process).

The analyzer's calculation factor can be derived from first principles using the following equation:

$$\text{Calculation Factor} = (C_{tit} \times RR \times U \times MW)/V_{samp}$$

where: $C_{tit}$=Titrant Concentration (moles/liter)
RR=Reaction Ratio (moles of sample that will react with each mole of titrant)
U=Unit factor (typical values: "1" for g/l, "0.1" for %, "1000" for mg/l etc.)
MW=Molecular Weight of sample species (e.g. HF=20)
$V_{samp}$=Volume of sample taken (typically 0.25–1 ml)

Alternatively, a "process calibration" can be performed, whereby the fluid component monitoring and concentration maintenance system is adjusted to match results from a laboratory analysis. This procedure may be required if the inflection point seeking algorithm is used, but laboratory procedures takes an endpoint (somewhat displaced) from the inflection point of the titration curve.

Having entered the laboratory-determined concentration, the fluid component monitoring and concentration maintenance system will calculate the conversion factor that relates concentration to titre value, and display that value. If no valid data is available, then an ERROR 32 will be generated.

The Analyzer Trigger Mode determines what controls the analysis timing. If the fluid component monitoring and concentration maintenance system is in LOCAL trigger mode, the analyzer will be operated through the keypad and its own internal timer.

If the fluid component monitoring and concentration maintenance system is in REMOTE trigger mode, the analyzer will await an external signal before beginning its analysis cycle. Typically, this signal would be a relay closure performed by an external programmable logic controller (PLC). After the analysis cycle is completed, the analyzer sends a ready signal as a handshake (via alarm relay). If the fluid component monitoring and concentration maintenance system is in COMPUTER trigger mode, it is fully controlled via its integral RS232 interface.

The Setup Screen 4, Analysis Timing, is shown in FIG. 11. This screen sets the parameters for the timing of the fluid component monitoring and concentration maintenance system. Inputs for time, date, and analysis interval are provided on this screen.

The Titre Frequency command sets the time interval between analysis cycles. Units are decimal minutes. If the titration actually takes longer than the programmed interval, the next titration will commence 5 seconds after the finish of the previous titration. In these 5 seconds the operator may abort a sequenced titration by pressing the active [STOP] soft key. If the titre frequency is less than or equal to one (1), then the fluid component monitoring and concentration maintenance system will perform mathematical models in a demonstration mode. If the value is less than 0.3, then the burettes will be inactive. At the same time the data bank will be loaded with computer generated data.

The Equilibration Time on the Setup Screen has a decisive effect on the speed and accuracy of the titration. This is the time allowed for the system to come to equilibrium after the dispensing of titrant. After each titrant addition, there will be a certain time required for the reagent to become perfectly mixed in the whole solution, then time for the sensor to equilibrate to the new mV value. An equilibration time of 6 seconds is typical for the Karl Fischer titration method.

The Data Smoothing entry on the Setup Screen takes cognizance of the fact that titration curves in non-aqueous solvent are sometimes extremely "noisy". The Data Smoothing parameter allows the titration curve to be smoothed mathematically, improving the consistency of analysis results. This parameter typically varies from 0.1 to 10. The Water-in-NMP application typically requires little smoothing, so the default value of 1 is generally adequate in such application.

The Setup Screens 5 and 7, Endpoint Parameters, are representatively illustrated in FIG. 12. These Setup Screens determine the parameters that will be used to define the shape of the analysis curve and how the endpoints are interpreted. The data fields are arranged in four columns (two on each screen) representing parameters for the four titration procedures:

B2 acid (burette 2, acid analysis)—these parameters are associated with the "Ta" command
B3H2O 1 (burette 3, water analysis 1)—these parameters are associated with the "Tw1" command
B3H2O 2 (burette 3, water analysis 2)—these parameters are associated with the "Tw2" command
B3 dry (burette 3, pre-dry)—these parameters are associated with the "Td" command The End Point entry on this Setup Screen reflects the fact that regardless of whether a fixed setpoint, seeking, or seek/set inflection point algorithm is used, the expected endpoint value (usually expressed in mV) must be given. In each case this value is used to assign the endpoint/inflection points to a particular parameter being measured.

The Sensor entry is set to KF for Karl Fischer titration.

The Window/Smoothing entry defines the tolerance (either side of the Endpoint parameter) in which the seeking algorithm will search for the endpoint. Whenever the electrode signal resides in this window, the titrant additions will be driven to their minimum allowable value. Although the algorithms to detect the endpoints are very robust, additional safety measures are provided by the Window/Smoothing capability to unambiguously interpret the endpoint data and to assign the appropriate results.

The "End" (Titre End) parameter defines the limit of the titration experiment; when this value is exceeded, the analysis will terminate. Using a fixed setpoint algorithm requires that the titre end be set at or shortly after the endpoint point. The self-seeking and seek/set inflection point algorithms, however, require that reagent be added to the sample in excess such that a symmetrical curve is obtained on both sides of the inflection point.

In respect of the Algorithm entry on the Setup Screen, three endpoint point algorithms are available:
SEEK—titrate to an inflection point ("self-seeking")
SETPOINT—titrate to a fixed setpoint value
SEEK/SET—titrate to an inflection point, then if failed to a fixed setpoint value The first algorithm is an advanced curve fitting routine that searches for the inflection point on the titration curve ("seeking" method).

The second algorithm is a "setpoint" method that finds the titre value for the position of the theoretical/preset end point programmed in the parameter list (i.e., the fluid component monitoring and concentration maintenance system titrates to a target electrode signal).

The third algorithm is a hybrid of the seeking and setpoint algorithms. In the event there is an insufficient number of points along the titration curve for the seeking method, the fluid component monitoring and concentration maintenance system will automatically shift to set-point analysis.

The seeking method will find the true inflection point regardless of the mV electrode drift (provided the drift stays within the defined endpoint window). This means that the electrode does not have to be calibrated. On the other hand, the value of the titre may differ from results obtained using a fixed set point titration if the position of the set point does not exactly correspond with the position of the inflection point on the analysis curve. For this reason the process calibration feature has been built into the fluid component monitoring and concentration maintenance system to provide the option of using the advanced inflection point seeking method, while allowing results to be scaled to match those obtained in a well calibrated laboratory setpoint determination.

The Titration Direction entry on the Setup Screen indicates the direction the sensor signal is expected to move as the analysis proceeds. If the sensor signal proceeds in the wrong direction, the analysis is aborted and an error code is displayed on the liquid crystal display (LCD) of the apparatus.

In addition to defining the expected sensor response, the Direction_1 and _2 options allow further control of the titrant addition mode. This can be particularly useful for titrations with very unpredictable and abrupt titration curve profiles. When using these modes, the expected endpoint volume is entered in the corresponding "goal" field of Setup Screens 6 and 8.

Setup Screens 6 and 8, Analysis Control, are representatively shown in FIG. 13. The analysis control screens determine how titrant is added and how the result is calculated/displayed.

Minimum and Maximum Increments (ml) entries are shown on the representative Setup Screen in FIG. 13. The minimum and maximum titre increments have a large influence on the speed and accuracy of the titration.

In principal, the smaller the minimum increment value the greater will be the accuracy. A small minimum increment will, however, result in a slow titration, since many more points will be measured. A maximum of measurement points is allowed per titration curve, to ensure that the minimum increment enables a complete curve will be taken with less than 201 points.

The maximum value defines the upper speed of the titre when far from the endpoint point. Care should be taken with large values in case the first few additions of reagent shoot the curve past the endpoint point.

All fluid component monitoring and concentration maintenance system titration endpoint determination algorithms interpolate between data points, thereby giving resolutions that are higher than the minimum reagent dispense volume.

The Pretitre/Goal entry reflects the fact that if sample concentration remains reasonably stable relative to the frequency of analysis, then it is likely that sequential analysis will yield similar endpoint volumes. Under these circumstances, it is possible to perform part of the next titration very rapidly by adding a proportion of the last titre in one "slug", thus coming close to the end point almost instantaneously. Such a "predose" will allow the titration to be performed with the maximum speed without sacrificing accuracy.

The pretitre parameter can be set to any value between 0 and 1; "0" represents no predose at all (i.e. titration proceeds normally) while "1" represents adding 100% of the last endpoint. Typical pretitre values are in the 0.2–0.7 range, depending on how predictable and stable the sample concentration proves to be.

When the UP/DOWN_1 or UP/DOWN_2 addition modes are selected in Setup Screens 5 and 7, then the pretitre fields becomes "goal" fields; in this case, the expected endpoint volume in ml. Is entered.

The Calculation Formula is selected on the Setup Screen, and in the FIG. 13 embodiment, is "normal." The conversion of the titration endpoint volume to a concentration reading (see discussion herein concerning Setup Screen 3, Calculation Factors) can be performed in several ways. The most common and simple is the "normal" calculation, in which the endpoint volume is directly multiplied by the calculation factor. However, a number of alternative calculations are available that permit more advanced titration techniques such as back titration to be exploited.

The Mix Correction entry on the Setup Screen is usually left at 0.00 for the Water-in-NMP application.

Although the fluid component monitoring and concentration maintenance system is typically provided for use with the default parameters pre-loaded, so that the apparatus is suitable for running the analysis quickly and accurately from the initial operation of the operation of the apparatus, the apparatus nonetheless may require adjustment to the default values during the operational life of the apparatus, to accommodate changes in process conditions, sensor response or new user requirements.

Figures 14, 15:
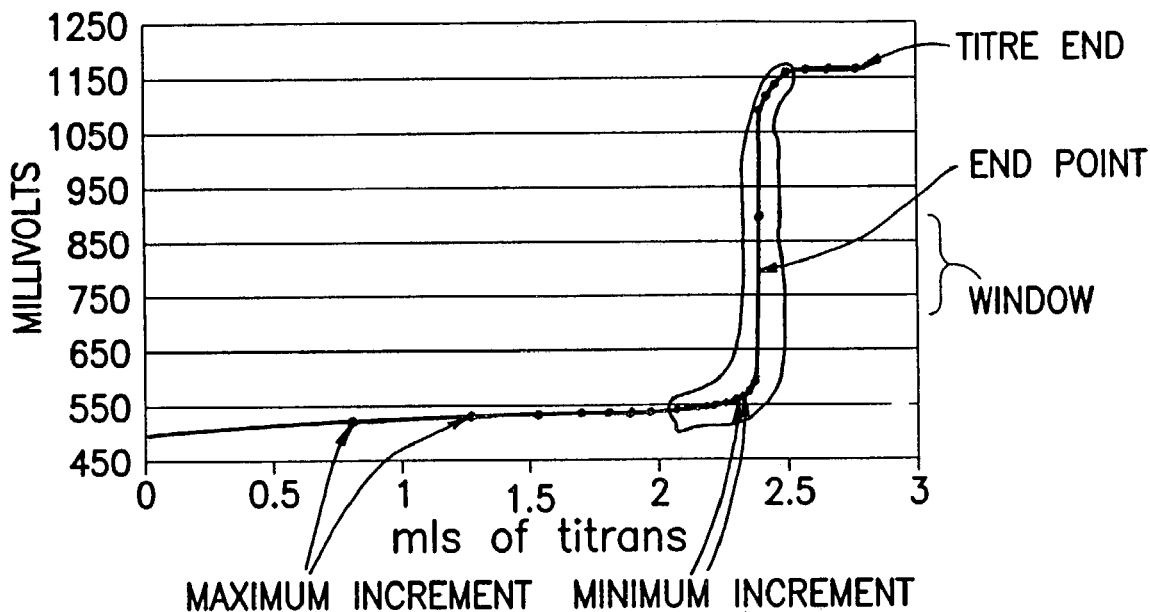
FIG. 14 shows a curve illustrating the values defined within the Setup Screens 5–8 of FIGS. 12 and 13.
FIG. 15 shows Service Screen 1, for the fluid component monitoring and concentration maintenance system.

The curve in FIG. 14 illustrates the values defined within the aforementioned Setup Screens 5–8. The endpoint is shown at 800 mV, but a 100 mV tolerance has been established by the Window setting. Therefore, the fluid component monitoring and concentration maintenance system will look between 700 and 900 mV for the point of inflection. The titre end is set at 1100 mV, allowing the curve to be drawn symmetrically, as required by the seeking algorithm. The maximum increments allow the analysis to be speedy, but once the fluid component monitoring and concentration maintenance system detects a change in the slope it will slow down the analysis to the minimum increment.

In the circled portion of the curve in the graph of FIG. 14, the data points are much closer together to give the fluid component monitoring and concentration maintenance system the best chance at finding the most accurate endpoint. This allows for a quick measurement, yet still maintains a high degree of accuracy.

The Service Screens 1 and 2 shown in FIGS. 15 and 16, respectively, allow testing of major functions of the fluid component monitoring and concentration maintenance system hardware, including all of the outputs, dispensers, relays and valves, by manually actuating them. They also allow programming of Macros.

In Service Screen 1, any item can be actuated by simply scrolling the cursor down to the chosen item and pressing [ENTER]. The digit to the right of the item will change from 0 to 1, and the operator will be able to observe the item actuating correctly.

Upon exiting the Service Screens, any actuated items will be automatically deactivated.

Up to 16 valve/relay selected operations can be custom programmed to create a custom operation such as switching on external pumps or customizing sampling operations. Up to five macros can be saved in the memory of the fluid component monitoring and concentration maintenance system.

To program a Macro, the [MAIN/MAC] button is first pressed and held for 10 seconds. Once in the Macro Screen, [START] is pressed and then the chosen valves were operated before [STOP] is pressed to save the sequence. When recalled, via the M command in Setup Screen 1, the Macro is repeated in exactly the same sequence (including timing).

Service Screen 2 (FIG. 16) features additional controls that flushing of the burettes, setting of the analog outputs etc.

The data screens of the fluid component monitoring and concentration maintenance system provide access to all of the stored data of the apparatus. The fluid component monitoring and concentration maintenance system stores up to 1400 measurements, with the most recent measurement replacing the oldest measurement.

The first Data Screen in FIG. 17 shows the data in numeric form. Pressing [UP] or [DOWN] moves the data one place. If these buttons are pressed for longer than 3 seconds, the display moves up or down one whole day to the first measurement of that day (first after midnight). Pressing [PRINT] will give access to the soft keys [RESULTS] or [CURVE]. Pressing [RESULTS] briefly will download, via the RS232 output of the Analytical Information Module, the data of the day currently shown in the display. Pressing for longer than 3 seconds will download all the data held in the memory. Pressing [CURVE] will download the last titration curve.

The second Data Screen in FIG. 18 shows the results in a graphical format, displayed in 24 hour blocks. To move between days the [BACK] and [FORWARD] softkeys are used. The [DISPLAY] key is used to move between components. The scale of the graph is determined by the analog outputs defined in Setup Screen 2.

The graphical display feature enables a quick glance at the process over a short time period. For a higher resolution, the data is downloaded to be imported into a spreadsheet. The downloading procedure using Windows 95/98 operating system software is set out below.

In Windows, click on the "Start" button. Move to "Programs," select "Accessories," and choose the "HyperTerminal" icon.

Click on the HyperTerminal icon.

Create a HyperTerminal icon, by giving the HyperTerminal directory an appropriate name such as "SemiChem." Now select an icon for the new "SemiChem" directory. When done, click "OK".

The Phone Number Window will be displayed next. Verify which COM port the RS232 cable is connected to on the computer. In most cases this will be COM 2.

To select COM2, move the cursor until "Direct to COM2" is displayed. Click on "OK."

The Port Setting Window will be displayed next. The following setting must be selected:

Bits per second: 2400
Data bits: 8
Parity: none
Stop Bits: 1
Flow Control: Hardware When this is done click "OK."

The apparatus is now ready to download data. From the HyperTerminal window click on the icon just created.

Next select "Transfer" from the menu bar. The Capture Text Window should now be displayed, and it should read:

Folder C:\Program Files\Accessories\Hyperterminal\Capture.txt

At this time rename the file with an appropriate name followed by the .txt extension.

On the Analytical Information Module, press the [DATA] softkey

On the Analytical Information Module, press the [PRINT] softkey

On the Analytical Information Module, press the [RESULTS] softkey for the analysis data, and press [CURVE] softkey for the most recent electrode response data.

The data from the fluid component monitoring and concentration maintenance system will be sent to the computer and displayed on the computer screen.

Once the Text Capture has stopped, the data can be imported into any spreadsheet program (as comma delimited text).

The following Setup Screens are typical of parameters suitable for analysis of water in NMP-type photoresist stripping solvent. In this example, solvent is analyzed only on stream 1, the sample size is 0.5 ml and the expected sample composition is 2 wt % water in NMP.

Setup Screen 1

| BLO C1 | Td | STL | W | S1w | Tw1 | BLO | W | BLO | C2 |
|---|---|---|---|---|---|---|---|---|---|
| 0.50 5.00 3.00 | | 1 | 0.30 | 0.40 | | 0.40 | 0.20 | 0.20 | 5.00 |

Setup Screen 2

Output 1 = Conc.1 Max. . . 2
Output 2 = Conc.2 Max. . . 2
Output 3 = Conc.3 Max. . . 2
Output 4 = Conc.4 Max. . . 2
Relays 1–6 = off Setup Screen 3

Calibration Type = Factor
Calculation Factor 1 = 1.000
Calculation Factor 2 = 1.000
Calculation Factor 3 = 1.000
Calculation Factor 4 = 1.000
Analyzer Trigger = Local -continued Setup Screen 4

Titration Frequency (min.) = 30
Equilibration Time (sec.) = 6
Data smoothing = 1.00
Acid Cal = 4.00
Water Cal = 1.00
Setup Screen 5

| | | |
|---|---|---|
| Endpoint (pH/mV) = | — | 200.00 |
| Endpoint Window = | — | 10.00 |
| Titre End = | — | 190.00 |
| Sensor = | — | KF |
| Algorithm = | — | Setpoint |
| Titrate up/down = | — | down |

Setup Screen 6

| | | |
|---|---|---|
| Min. Increment (ml) = | — | 0.01 |
| Max. Increment (ml) = | — | 0.05 |
| Pre-titre/Goal = | — | 0.00 |
| Calculation Formula = | — | Normal |
| Units = | — | % |
| Mix Corr. = | — | 0.00 |

Setup Screen 7

| | | |
|---|---|---|
| Endpoint (pH/mV) = | — | 200.00 |
| Endpoint Window = | — | 10.00 |
| Titre End = | — | 190.00 |
| Sensor = | — | KF |
| Algorithm = | — | Setpoint |
| Titrate up/down = | — | down |

Setup Screen 8

| | | |
|---|---|---|
| Min. Increment (ml) = | — | 0.01 |
| Max. Increment (ml) = | — | 0.03 |
| Pre-titre/Goal = | — | 0.00 |
| Calculation Formula = | — | Normal |
| Units = | — | % |
| Mix Corr. = | — | 0.00 |

After the fluid component monitoring and concentration maintenance system has been installed, the reagents have been flushed and the system software reviewed, the fluid component monitoring and concentration maintenance system is ready for analysis service.

The Run Screen is shown in FIG. 19, and contains all data related to the current analysis. This screen displays the concentration for samples number 1 through 4 (if provided). It also displays the current/last analysis curve, which is generated in real-time during analysis.

Upon pressing [RUN], the analyzer will start its first analysis, then repeat at the interval specified in Setup Screen 4. If [SINGLE] is pressed, the analyzer will start a single analysis and, once finished, will remain idle until it receives a further command.

Figure 20:
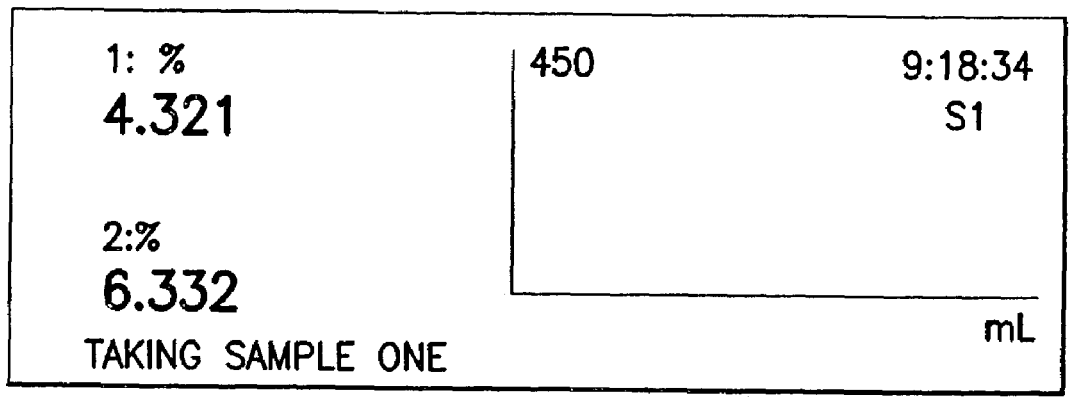
FIG. 20 shows a screen appearing after the analyzer has started its analysis sequence, indicating the current step ("S1") in the analysis sequence underneath the time.

When the analyzer has started its analysis sequence, the upper right corner of the display, as illustratively shown in FIG. 20, indicates the current step ("S1") in the analysis sequence underneath the time. During the analysis sequence, the [MAIN], [RUN], and [SINGLE] buttons are gone. At this time the analysis can only be interrupted by pressing the [RESET] button, which abruptly stops the analysis and returns the operator to the Run Screen.

Underneath the sample concentration, which at this point reads 0.000, a line of text is displayed, indicating the function currently being performed. In this case "Taking Sample One" is displayed. The fluid component monitoring and concentration maintenance system will go through the default sampling sequence and begin the titration.

Figure 21:
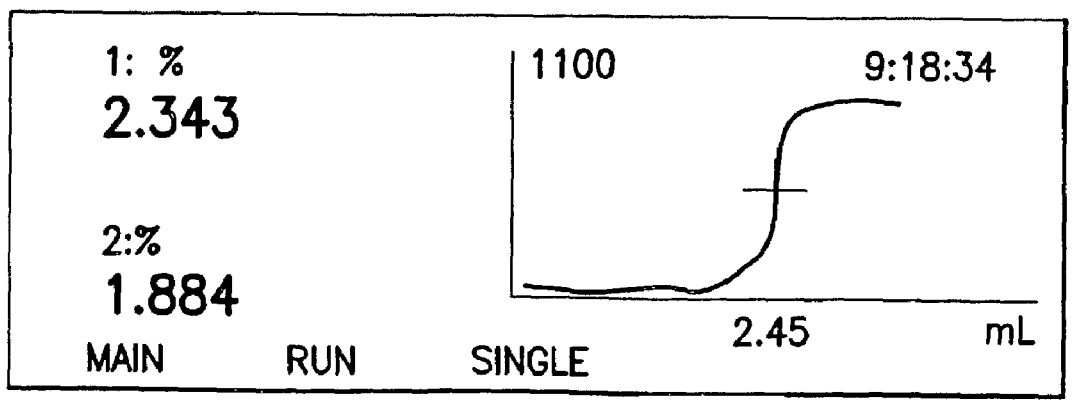
FIG. 21 shows a screen appearing once the analysis is completed, identifying a water concentration, as a number of milliliters of titrant required to reach the endpoint.

Once the analysis is completed, the screen shown in FIG. 21 is displayed, identifying a water concentration of 2.343, which is the number of milliliters of titrant required to reach the endpoint. In this illustrative example, no calculation factor has previously been entered in Setup Screen 3.

Subsequent to display of numeric information as shown in FIG. 21, the fluid component monitoring and concentration maintenance system is ready to be calibrated to the associated semiconductor manufacturing process. The calibration process may comprise a "factor" calibration method, whereby the Calculation Factor is calculated from first principles, as previously discussed herein. Alternatively, a "process" calibration may be performed, in which the analyzer is re-scaled to correlate with a laboratory analysis result.

A process calibration may be carried out in a "stop" mode. This is the simplest way to perform a process calibration, but requires the fluid component monitoring and concentration maintenance system to remain off-line for the duration of the reference laboratory test procedure. The procedure is as follows:

Verify that the fluid component monitoring and concentration maintenance system is running under normal process conditions, and functioning correctly. If the process is not operating (i.e. there is no sample flow), do not proceed with the calibration.

Press [SINGLE].

Take a grab sample during or immediately after the fluid component monitoring and concentration maintenance system has captured its sample for analysis. This ensures that the samples are the same.

While the fluid component monitoring and concentration maintenance system is completing its analysis procedure, subject the grab sample to analysis using a reliable reference laboratory method.

Once the fluid component monitoring and concentration maintenance system has completed its analysis, advance to the Sign-on Screen by pressing [MAIN]. Press [SETUP], then [NEXT] until Setup Screen 3 is reached.

Set the Calibration Type parameter to "Process".

Scroll [DOWN] to the appropriate Calculation Factor line (e.g., factor #1 for analysis #1, etc.). Press [ENTER], and dial in the result of the laboratory analysis (in the appropriate units, e.g. %, g/l, etc.). Once the last digit is entered, pressing [ENTER] again will cause the fluid component monitoring and concentration maintenance system to re-calculate the Calculation Factor. Thus will be used in all subsequent measurements.

Exit the Setup Screens by pressing the [MAIN] key once. Press the [RUN] key to return to the Run Screen. The displayed result should now match the laboratory result previously entered.

An alternative procedure is to perform the process calibration in "run" mode, calibrating against a laboratory test performed while the fluid component monitoring and concentration maintenance system remains on-line. This is particularly useful if the sample has to be sent to another department or external laboratory for analysis. The procedure is as follows:

Verify that the fluid component monitoring and concentration maintenance system is running under normal process conditions, and functioning correctly. If the process is not operating (i.e., there is no sample flow), do not proceed with the calibration.

The fluid component monitoring and concentration maintenance system will likely be in Run mode, so wait until the next analysis cycle begins.

Take a grab sample during or immediately after the fluid component monitoring and concentration maintenance system has captured its sample for analysis. This ensures that the samples are the same.

Once the fluid component monitoring and concentration maintenance system has completed its analysis, record the displayed result, as displayed result "C1".

Analyze the grab sample using a reliable reference laboratory method. Record the laboratory test result, as result "A1."

Exit the fluid component monitoring and concentration maintenance system Run mode by pressing the [STOP] key (visible between analysis cycles). Record the fluid component monitoring and concentration maintenance system's currently displayed result, as displayed result "C2".

Advance to the Sign-on Screen by pressing [MAIN].

Advance to Setup Screen 3 by pressing [SETUP] then [NEXT] twice.

Calculate the "adjusted calibration value" (CAL) as follows:

$$CAL = (A1/C1) \times C2$$

Set the Calibration Type parameter to "Process".

Scroll [DOWN] to the appropriate Calculation Factor line (e.g., factor #1 for analysis #1, etc.). Press [ENTER], and dial in the CAL value. Once the last digit has been entered, pressing [ENTER] again will cause the fluid component monitoring and concentration maintenance system to re-calculate the Calculation Factor. This will be used in all subsequent measurements.

Exit the Setup Screens by pressing the [MAIN] key once. Press the [RUN] key to return to the Run Screen. The displayed result should now match the CAL value previously entered.

This calculation protocol is intended to compensate for possible changes in the process chemistry between the time the grab sample was taken and when the Calculation Factor is updated.

An illustrative example is set out below.

EXAMPLE

The analyzer's displayed result at the time of the grab sample was 3.863 wt % (C1).

Laboratory analysis reports the concentration of the grab sample to be 4.101 wt % (A1).

The analyzer's displayed result at the time of updating the calibration is 3.422 wt % (C2)

$$CAL = (4.101/3.863) \times 3.422 = 3.633$$

Therefore, the adjusted calibration value (CAL) is 3.633 wt %.

Set out below is an identification of error codes of the Analytical Information Module of the fluid component monitoring and concentration maintenance system, such as may be encountered in the operation of the apparatus, together with a tabulation of the meanings and severity of such error codes.

| error code | meaning | severity |
|---|---|---|
| 1 | The sample is already neutral (detection in single endpoint inflection point mode) | Fatal: Analyzer will not proceed with analysis until problem is corrected |
| 2 | The sample is already neutral (detection of first endpoint in dual inflection point mode) | Fatal: Analyzer will not proceed with analysis until problem is corrected |
| 4 | The sample is already neutral (detection of second endpoint in dual-inflection point mode) | Fatal: Analyzer will not proceed with analysis until problem is corrected |
| 8 | Too many data points (increments too small) | Warning: Accurate detection of endpoint may not be possible |
| 16 | Calculation of results impossible (incompatible output assignments) | Fatal: Analyzer will not proceed with analysis until problem is corrected |
| 32 | Process calibration received invalid concentration data | Warning: Analysis proceeds using old data |

In one embodiment of the invention, multiple error-states are indicated by a composite error code. To decode, simply subtract the highest error code possible and keep doing so until 0 is reached. For example, E40=E32+E8.

The correlation of real-time analysis curves and error codes provides a conjoint analytical approach to analysis of the fluid component monitoring and concentration maintenance system performance.

The real-time analysis curves can be utilized as a "fingerprint" for a particular analysis. Interpretation of error codes should be done in conjunction with an evaluation of the curve shape. The ensuing discussion is directed to the relationship between the error codes and the curve shape.

Figure 22:
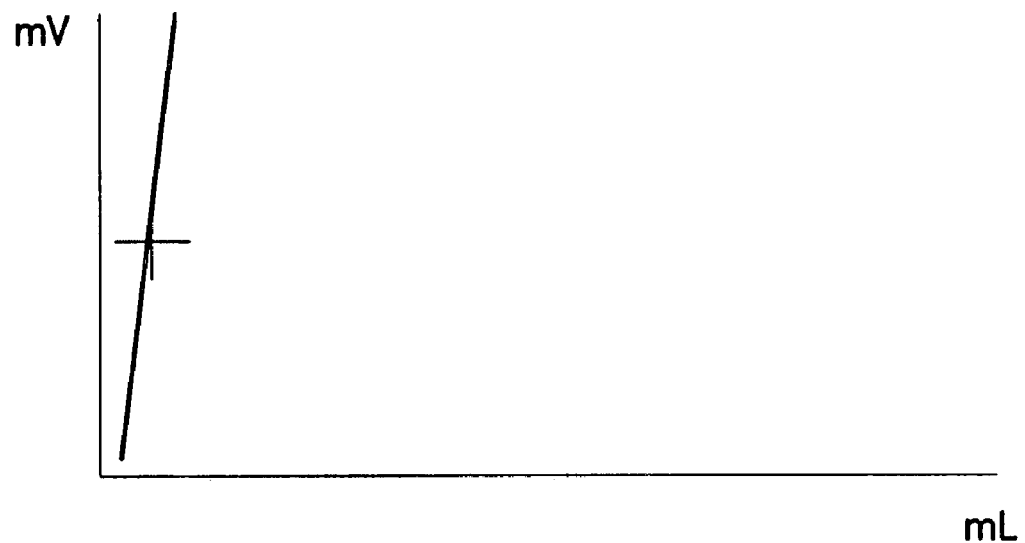
FIG. 22 shows a real-time analysis curve 1, displaying a rapid change in sensor mV suggesting a lack of sample.

Curve 1 is shown in FIG. 22. This rapid change in sensor mV suggests a lack of sample.

The first small amount of titrant, when added to the pure solvent, causes the sensor response to jump immediately to the titre end. This may be accompanied by an E1 error code. The calculated results would most likely be very low (or even 0).

In this case, check that the sample is being delivered from the process to the reaction vessel correctly.

Figure 23:
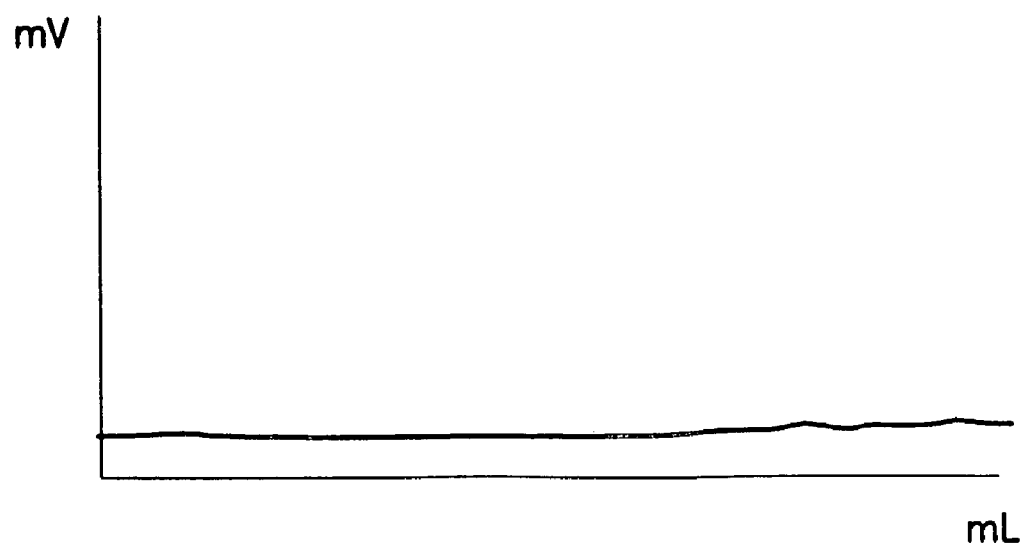
FIG. 23 shows a real-time analysis curve 2, exhibiting a "flat" sensor response whose cause, if the sensor mV is in an unexpected range, may indicate a faulty sensor, connection, pre-amp or other electronic fault, or, if the sensor mV remain in the normal pre-endpoint range, may indicate that reagent is not reaching the reaction vessel.

Curve 2 is shown in FIG. 23. A "flat" sensor response like this can have two causes.

First, if the sensor mV is in an unexpected range, then this may indicate a faulty sensor, connection, pre-amp or other electronic fault.

On the other hand, if the sensor mV remains in the normal pre-endpoint range, then reagent may not be reaching the reaction vessel. This would typically be accompanied by an E8 error code. The level of reagents should be checked, and it should be verified that the burette is filled and functioning properly.

Figure 24:
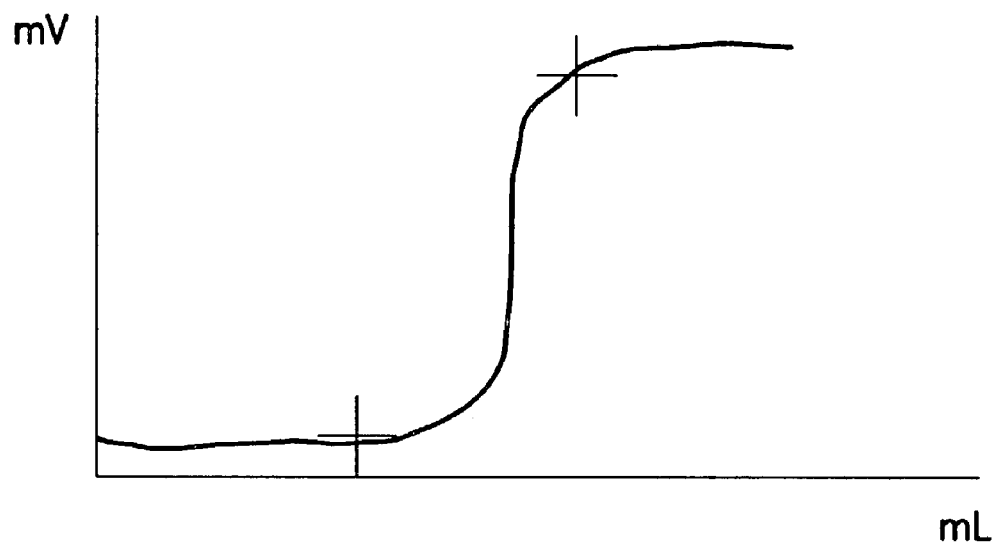
FIG. 24 shows a real-time analysis curve 3, reflecting a scenario that usually occurs when the endpoint interpretation parameters have been changed within the Setup Screens, but the chemistry remains the same, indicating that the Setup parameters should be carefully reviewed, or that a sensor that has drifted out of the normal endpoint window and should be cleaned or replaced as necessary.

Curve 3 is shown in FIG. 24. This scenario usually occurs when the endpoint interpretation parameters have been changed within the Setup Screens, but the chemistry remains the same.

In this case, the Setup parameters should be carefully reviewed, and the passcode feature is desirably employed to safeguard Setup parameters from unauthorized access.

Another cause can be a sensor that has drifted out of the normal endpoint window. If the Setup parameters are correct, the sensor should be cleaned or replaced as necessary.

Figure 25:
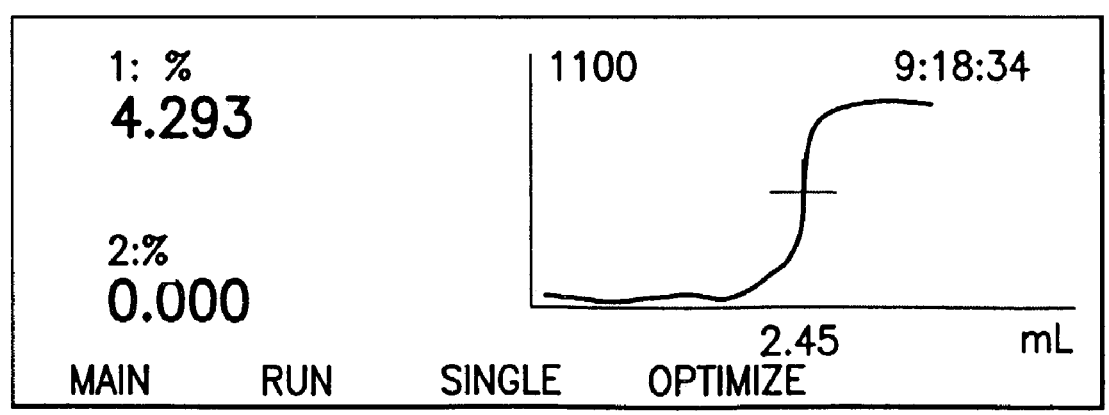
FIG. 25 shows a Run Screen appearing after an analysis is completed, displaying an [OPTIMIZE] menu option allowing for the optimization of the endpoint and the minimum and maximum increments used.

After an analysis is finished, the analyzer will display an [OPTIMIZE] menu option in the Run Screen, as shown in FIG. 25. This feature allows for the optimization of the endpoint and the minimum and maximum increments used.

To use the Optimize Screen, press [OPTIMIZE]. This will generate the screen shown in FIG. 26.

This screen allows selection of the endpoint with the greatest gradient (strongest point of inflection), and thus optimization of the endpoint and increments to find this endpoint every time. In the above case, [UP] is pressed until the 0.36/750/265.30 line is at the top, then [SELECT] is pressed. The Setup parameters then are automatically optimized to the selected point. Care should be exercise with this procedure, since if an inappropriate endpoint is selected, the Setup parameters will be inadvertently changed, and will adversely impact the analysis accuracy.

The fluid component monitoring and concentration maintenance system is preferably maintained on a regular maintenance schedule, involving replenishment of reagents, replacement of burette O-rings, updating of Analytical Information Module software, refurbishing/replacement of electrodes, etc.

While the invention has been described herein with primary reference to the use of Karl Fischer titration techniques in respect of monitoring and control of water in semi-aqueous solvent media, it will be appreciated that the invention is susceptible of use with other analytical techniques and chemistries, and/or for monitoring and control of other fluids than semi-aqueous solvent media, and/or for monitoring and control of other fluid components than water.

In lieu of the specifically described methodology for monitoring and controlling the concentration of the water component of a sample using the classic Karl Fischer titration methodology, alternative methods of analysis that can also be used include spectroscopic analysis of infrared and near infrared frequency fluctuations, measurement of variations in the multicomponent solution conductivity, and the use of ultrasonic wave generation, e.g., involving impingement of ultrasonic energy on the sample liquid, and measurement of the response of the sample thereto.

By way of further specific examples, the method of the invention may be practiced with ultraviolet-visible detection and monitoring of liquid species in liquid multicomponent compositions, or with microelectromechanical devices (MEMs) for detection and monitoring of gas species of multicomponent gas compositions, thermopile device-based detection and monitoring of gaseous species in a multicomponent gas composition, and electrochemical cells of varied types for detection and monitoring of liquid species of multicomponent liquid compositions.

The invention in application to water monitoring and control of semi-aqueous solvent media thus provides an apparatus and method for extracting small amounts of the clean chemistry, such as solvent mixtures used for photoresist and post-etch residue removal, measuring the water content of the clean chemistry, and responsively injecting additional water as necessary to maintain water concentration within appropriate levels. In solvent compositions based on NPM, the amount of water in the chemistry is a critical feature in determining bathlife. If the water level in the solvent composition is too low, the cleaning efficiency will be reduced. If the water level is too high, there is a strong risk of metal corrosion. It therefore is critical to maintain water level within a strict range of concentration. When the water level is appropriately maintained, the bathlife can be extended substantially, e.g., 2–3 times, beyond the level achievable without monitoring and water control concentration maintenance. The increased bathlife reduces chemical usage and chemical waste, as well as the need for downtime to facilitate chemical changeouts. Additionally, the increased bathlife and associated maintenance of the value of the water concentration in the solvent composition enables tight process control and higher yields to be realized.

The water monitoring and control apparatus and method of the invention thus effects injection of water into semi-aqueous solvent mixtures as needed to maintain a predetermined level of water concentration in the solvent composition for maximizing its efficiency.

The invention embodies a real-time chemical bath monitoring and replenishment system, which may be usefully employed in a wide variety of applications, including semiconductor manufacturing operations such as photoresist and post-etch residue removal from semiconductor device structures and precursor articles, chemical-mechanical planarization in which solvent components ratios in the CMP composition are critical to the material removal operation, as well as other applications in which one or more solvent components of a multi-component composition are susceptible to analytical assessment and monitoring.

In another aspect of the invention, there is provided a means and method of generating and monitoring species such as $H_2O_2$.

Hydrogen peroxide ($H_2O_2$) used in semiconductor processes is typically of unknown concentration due its spontaneous decomposition into water over time.

The present invention in a specific embodiment resolves such problem, by carrying out electrochemical generation of high purity peroxide at the point of use, and performing real time quantitative analysis of the peroxide as it is generated and in the process in which it is being used.

The generation of hydrogen peroxide in accordance with such aspect of the invention is carried out by electrochemical means. Such electrochemical generation of hydrogen peroxide is extremely efficient. For example, hydrogen peroxide can be generated in an electrochemical cell, e.g., to produce at least 0.054 mol of peroxide in a basic medium of sodium hydroxide using only 150 mA.

A Karl Fisher dual electrochemical cell (e-cell) arrangement may be used as the platform in conjunction with a constant current source with a Ag/AgCl reference electrode. The working electrode (cathode in this case) connected to the current source can be constituted by a sintered carbon/PTFE composite disk in intimate contact with a nichrome screen. This electrode is highly porous and as such allows oxygen to diffuse through at a rapid rate to promote the formation of peroxide at the cathode. The anode material can be graphite or $Pb/PbO_2$ prepared as described in Brillas, E., *J. Electrochem Soc.*, 142 (1995) 1733, the disclosure of which hereby is incorporated herein by reference in its entirety. In basic solution this cathode configuration will catalyze a two-electron reduction of oxygen to peroxide via the hydroperoxide anion:

$$O_2 + H_2O + 2e = HO_2^- + HO^-.$$

Transition metal catalysts may also be added to facilitate the reduction process and to increase peroxide yield or improve the reaction efficiency.

Figure 27:
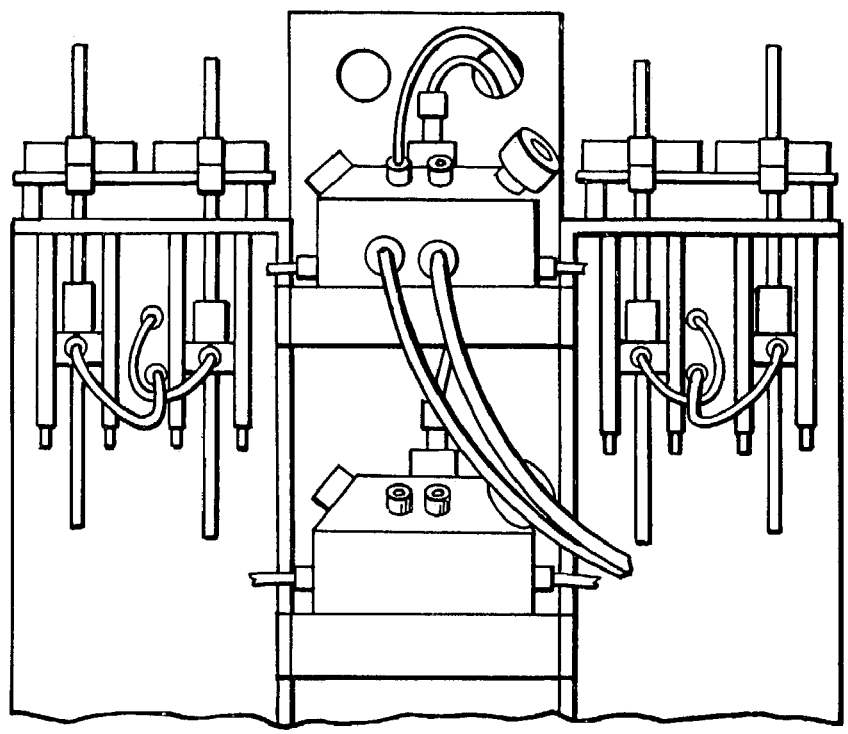
FIG. 27 shows an apparatus for the generation of hydrogen peroxide and monitoring of same, utilizing a Karl Fischer analysis tray.

The equipment configuration for this generation of hydrogen peroxide and monitoring of same may be advantageously carried out in the equipment configuration shown in FIG. 27, utilizing a Karl Fischer analysis tray. The top cell is used for the generation of the peroxide and a small aliquot is removed using the syringe pumps and shuttled to the cell below where it can be tested using permanganate or ceric ammonium sulfate. The bulk of the peroxide generated can be shuttled to a holding vessel by pressurizing the cell.

The top cell uses two platinum electrodes that are easily modified to hold a $Pb/PbO_2$ electrode and a composite graphite/Teflon electrode.

Peroxide concentration, e.g., in chemical mechanical planarization (CMP) slurries employed in semiconductor manufacturing processes for polishing of semiconductor devices and device precursor structures, can be easily monitored by titrating with permanganate or ceric ammonium sulfate. Other transition metal salts may be used with corresponding advantage, e.g., Fe complexes such as $NH_4Fe$(oxalate), $NH_4Fe$(sulfate) or $NH_4Fe$(nitrate), to carry out the following reactions:

$$2Fe^{+3} + 2e^- = 2Fe^{+2}$$

$$2Fe^{+2} + 2O^- = O_2 + 2Fe^{+3}$$

Figure 28:
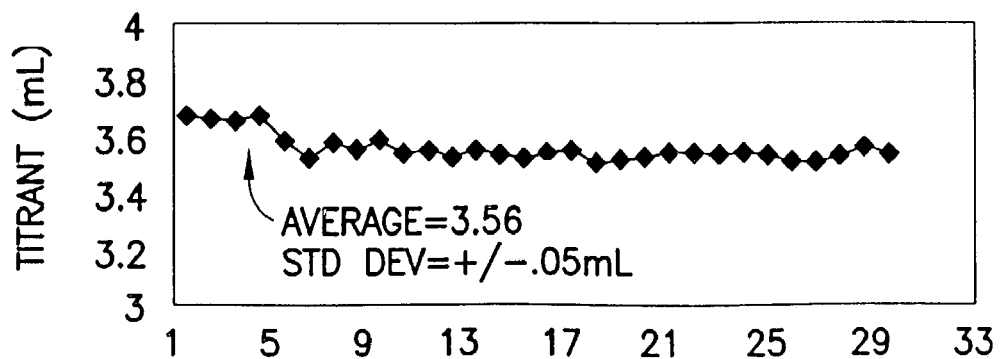
FIG. 28 is a graph of titrant volume as a function of titration cycles using ceric ammonium sulfate, and showing the reproducibility of 2.5% peroxide determination.

FIG. 28 is a graph of titrant volume as a function of titration cycles using ceric ammonium sulfate, and showing the reproducibility of 2.5% peroxide determination.

The half reactions for the titration of $H_2O_2$ with standard $Ce^{+4}$ are:

$$2Ce^{+4} + 2e^- \rightarrow 2Ce^{+3}$$

$$2O^- \rightarrow O_2 + 2e^-$$

The complete reaction for this titration is:

$$2Ce^{+4} + 2O^- \rightarrow O_2 + 2Ce^{+3}.$$

The invention in another aspect relates to the generation and monitoring of hydrazine and hydroxylamine.

Hydroxylamine and hydrazine are used as active reagents in several semiconductor processing operations. However, both chemicals present a transport and storage problem due to their explosive nature and high reactivity. In-situ generation is highly advantageous as solid hydroxylamine is known to rapidly detonate when dried.

The present invention resolves the aforementioned difficulties by (i) electrochemical generation of these compounds at their point of use, (ii) simultaneous real-time process monitoring of the concentration of these chemicals both in the electrochemical cell and at the point of use, and (iii) use of a modified Karl Fisher electrochemical cell platform for both the generation and monitoring of these compounds. While described below in reference to hydroxylamine, it will be appreciated that corresponding procedures may be employed for the generation and monitoring of hydrazine in accordance with the invention.

The electrosynthesis of hydroxylamine by be effected by reduction reaction in mild nitric acid solutions at a mercury amalgam electrode:

$$NO_3^- + 7H^+ + 6e^- = H_2NOH + 2H_2O$$

Alternatively, glassy carbon electrodes with a thin polymer membrane, formed from polyphenylenediamine in nitric acid, can be used to promote this reaction and suppress further reduction to ammonia. Typical current densities are under 1 $A/cm^2$.

Using a Karl Fisher platform or a similar electrochemical cell platform, hydroxylamine can be generated in one cell, a small aliquot shuttled to the second cell, and an analysis performed to detect the presence and concentration of hydroxylamine. Likewise, sample from the process (utilizing the hydroxylamine) can be taken on board the analysis tool via a six port valve and analyzed in a similar manner, preferably in an automated manner.

Since hydroxylamine is reducible to ammonia at a platinum electrode, subsequent titration with an oxidizer such as permanganate can be monitored with an oxidation-reduction potential (ORP) electrode.

Another potential synthetic method for generating hydroxylamine bubbles both $NH_3$ and $O_2$ gas into an aqueous solution in an electrochemical cell, as described herein. Transition metal catalysts may also be added to enhance the reaction efficiency and to increase the overall yield of formation.

A dual cell apparatus of the type as shown in FIG. 28 may be employed wherein the top cell is utilized to monitor sample from the process bath or the lower cell for hydroxylamine concentration.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary

What is claimed is:

1. A multicomponent fluid composition monitoring and compositional control system for monitoring and adjusting the concentration of water in a multicomponent fluid composition, said monitoring and compositional control system comprising:
   (a) an analyzer unit constructed and arranged to monitor the concentration of water in a multi-component fluid using a real-time Karl Fischer titration;
   (b) a sampling system constructed and arranged to automatically retrieve a sample of a multi-component fluid from a fluid-using process facility and deliver said sample to said analyzer unit; and
   (c) a control unit, constructed and arranged to compare the results of the real-time Karl Fisher titration to pre-programmed specifications and responsively control dispensing of water from a source of water into the multicomponent fluid of said fluid-using process facility;
   said monitoring and compositional control system including a first connection adapted for coupling with the fluid-using process facility to enable flow of multicomponent fluid from the fluid-using process facility to the sampling system, and a second connection adapted for coupling the control unit with the fluid-using process facility to control dispensing of water to the multicomponent fluid of the fluid-using processing facility;
   said analyzer unit including at least one electrode for effecting the Karl Fisher titration; and
   a sampling chamber arranged to receive multicomponent fluid from the fluid-using process facility.

2. The system of claim 1, wherein said fluid-using processing facility comprises a semiconductor manufacturing facility.

3. The system of claim 1, wherein said sampling chamber comprises a bath adapted to be connected to the fluid-using processing facility to enable multicomponent fluid to flow to said bath and return to the fluid-using processing facility.

4. The system of claim 3, wherein the analyzer unit is constructed and arranged to conduct said Karl Fischer titration on fluid withdrawn from the bath.

5. The system of claim 4, wherein the control unit has incorporated therein pre-programmed specifications that include volume of the bath being monitoring, frequency of monitoring wide titration calculation factor for calibration.

6. The system of claim 3, wherein the bat comprises a recirculating bath.

7. The system of claim 3, wherein the bath comprises a non-recirculating bath.

8. The system of claim 1, comprising a source of titration reagent(s) for conducting the Karl Fischer titration.

9. The system of claim 8, wherein the reagent(s) for conducting the Karl Fischer titration comprise dried reagents.

10. The system of claim 8, wherein the source of the titration reagent(s) comprises a multiplicity of glass burettes and a digital linear actuator controller for controllably dispensing reagents from said burettes.

11. The system of claim 10, wherein said burettes comprise three burettes respectively containing Karl Fischer solvent K in a first burette, methanol in a second burette, and Karl Fischer titrant K in a third burette.

12. The system of claim 11, wherein said analyzer unit and control unit are constructed and arranged to carry oat a sequence comprising retrieving the sample of the multicomponent fluid from the fluid-using processing facility, titrating the sample with titrant reagent emptying the reaction vessel, and flushing the reaction vessel with methanol.

13. The system of claim 8, wherein the sampling system is constructed and arranged to transfer the sample of the multicomponent fluid to the analyzer unit in admixture with at least one titration reagent.

14. The system of claim 13, further comprising a dryer adapted to dry the titration reagent(s) prior to mixing the titration reagent(s) with the sample.

15. The system of claim 1, further comprising a constant-current module for the detection of the endpoint of the Karl Fischer titration.

16. The system of claim 1, wherein said at least one electrode comprises a dual platinum sensor.

17. The system of claim 1, wherein the analyzer unit comprises a reaction vessel with mixer.

18. The system of claim 17, wherein the sampling system is arranged to capture a sample from a by-pass loop of a flow stream of said multicomponent fluid of the fluid-using process facility.

19. The system of claim 17, wherein the reaction vessel with mixer is constructed and arranged to receive the sample of said multicomponent fluid, analytical titration reagent(s) for conducting the Karl Fischer titration and one or more cleaning solvents for cleaning the reaction vessel following performance of the titration.

20. The system of claim 1, wherein said analyzer unit, said control unit or both include a display for visual observation of results generated by said unit(s) display unit .

21. The system of claim 1, wherein the control unit includes a computer and a display for visual observation of outputted data of the unit.

22. The system of claim 1, wherein the analyzer unit comprises at least one electrode, a reaction vessel with mixer and a titration reagent dispensing system, and the analyzer unit and the sampling system are disposed in a unitary module within a housing.

23. The system of claim 1, wherein the control unit comprises a computer storing parameters for conducting a specific analysis sequence, finding the endpoint(s) of the analysis, calculating and reporting analysis results.

24. The system of claim 23, wherein the control unit comprises a display for visually presenting the analysis results.

25. The system of claim 23, wherein the control unit includes a display selectively presenting Setup Screens, Calibration Screens, Service Screens, Data Screens, Run Screens and Sign-on Screens.

26. The system of claim 23, wherein the analyzer unit and control unit are constructed and arranged to carry out a sequence comprising converting the volume of titrant used in reaching an endpoint of the Karl Fischer titration analysis into units of concentration of water in the multicomponent fluid.

27. The system of claim 26, wherein the analyzer unit and control unit are constructed and arranged to carry out said sequence using a calculation factor determined by sample size, titration reagent concentration, titration reaction stoichiometry, and required result units.

28. The system of claim 27, wherein the calculation factor is determined as:

$$\text{Calculation Factor} = (C_{tit} \times RR \times U \times MW)/V_{samp},$$

wherein:

$C_{tit}$=Titrant Concentration (moles/liter)

RR =Reaction Ratio (moles of sample that will react with each mole of titrant)

U=Unit factor (using values selected from "1" for g/l, "0.1" for %, and "1000" for mg/l)

MW=Molecular Weight of sample species $V_{samp}$ =volume of sample taken (ml).

29. The system of claim 26, wherein the analyzer unit and control unit are constructed and arranged to carry out said sequence involving a process calibration.

30. The system of claim 26, wherein the analyzer unit and control unit are constructed and arranged to carry out said sequence and to output a visual display output of said concentration of water in the multicomponent fluid.

31. The system of claim 26, wherein the analyzer unit and control unit are constructed and arranged to selectively vary rate of sampling of the multicomponent fluid.

32. The system of claim 26, wherein the analyzer unit and control unit are constructed and arranged to selectively smooth a titration reaction curve from the Karl Fischer titration, to improve consistency of determined concentration of water in the multicomponent fluid.

33. The system of claim 26, wherein the analyzer unit and control unit we constructed and arranged to determine endpoint of the Karl Fischer titration using an inflection point algorithm.

34. The system of claim 26, wherein the analyzer unit and control unit are constructed and arranged to determine endpoint of the Karl Fischer titration using an algorithm selected front the group consisting of SEEK, SETPOINT and SEEK/SET endpoint algorithms.

35. The system of claim 26, wherein the analyzer unit and control unit we constructed and arranged to import titration data determined from the Karl Fischer titration into a spreadsheet.

36. A process for real-time monitoring and compositionally controlling the water content of a multicomponent fluid used in a fluid-using processing facility, said process comprising:
(i) retrieving a sample of the multicomponent fluid from said fluid-using processing facility;
(ii) analyzing said sample using a real-time Karl Fischer titration of the multicomponent fluid in order to determine its water content;
(iii) comparing the results of the analysis to pre-programmed specifications for the water content; and
(iv) responsively controlling dispensing of water to the multicomponent fluid of the fluid-using processing facility; wherein said process is conducted using a monitoring and compositional control system comprising:
(a) an analyzer unit constructed and arranged to monitor the concentration of water in the multicomponent fluid using said real-time Karl Fischer titration of the multicomponent fluid;
(b) a sampling system constructed and arranged to automatically retrieve the sample of the multicomponent fluid from the fluid-using process facility and deliver said sample to said analyzer unit; and
(c) a control unit constructed and arranged to compare results of the real-time Karl Fisher titration to pre-programmed specifications and responsively control dispensing of water from a source of water into the multicomponent fluid of said fluid-using processing facility;
said monitoring and compositional control system including a first connection adapted for coupling with the fluid-using process facility to enable flow of multicomponent fluid from the fluid-using process facility to the sampling system, and a second connection adapted for coupling the control unit with the fluid-using process facility to control dispensing of water to the multicomponent fluid of the fluid-using Processing facility;
said analyzer unit including at least one electrode for effecting the Karl Fisher titration; and
a sampling chamber arranged to receive multicomponent fluid from the fluid-using process facility.

37. The process of claim 36, wherein the fluid-using processing facility from which the sample of the multicomponent fluid is retrieved is selected from the group consisting of etching, spin-on coatings application, wafer solvent drying operations, and photoresist and post-etch residue removal.

38. The process of claim 37, wherein the fluid-using processing facility is adapted for removing photoresist and post-etch residue from a semiconductor device structure.

39. The process of claim 36, wherein the multicomponent fluid comprises a semi-aqueous solvent composition.

40. The process of claim 39, wherein the semi-aqueous solvent composition comprises water and a photoresist stripping solvent.

41. The process of claim 36, wherein said sampling chamber comprises a bath which is connected to the fluid-using processing facility whereby the multicomponent fluid of the fluid-using process facility flows to the bath and back to the fluid-using processing facility.

42. The process of claim 41, wherein the pro-programmed specifications include volume of the bath being monitored, frequency of monitoring and a titration calculation factor for calibration.

43. The process of claim 36, wherein the analyzer unit further comprises a source of titration reagent(s) and said real-time Karl Fisher titration involves the step of supplying said titration reagent(s) for conducting the Karl Fischer titration.

44. The process of claim 43, further comprising the step of pre-titration drying of the reagents for conducting the Karl Fischer titration.

45. The process of claim 43, further comprising determining the endpoint of the Karl Fischer titration using a constant-current module.

46. The process of claim 45, wherein the analyzer unit comprises a dual platinum sensor and the determination of the endpoint of the Karl Fischer titration is performed using the dual platinum sensor.

47. The process of claim 46, wherein the multicomponent fluid comprises an amine-based, alkaline aqueous solvent mixture.

48. The process of claim 47, comprising maintaining a stable water concentration in the wine-based, alkaline aqueous solvent mixture over an extended time of at least 24 hours.

49. The process of claim 43, wherein the analyzer unit comprises a reaction vessel with mixer.

50. The process of claim 49, comprising mixing the sample of said multicomponent fluid with titrating reagent(s) in said reaction vessel.

51. The process of claim 50, wherein the analyzer unit further comprises a source of a cleaning solvent and the reaction vessel is cleaned with the cleaning solvent following performance of the titration.

52. The process of claim 49, wherein the analyzer unit further comprises a multiplicity of glass burettes containing one or more titration reagents, a cleaning solvent or both and a digital linear actuator controller for controllably dispensing the titration reagent, cleaning solvent or both from said burettes, for conducting analysis of the multicomponent fluid.

53. The process of claim 52, wherein said burettes comprise three burettes respectively containing Karl Fischer solvent K in a first burette, methanol in a second burette, and Karl Fischer titrant K in a third burette.

54. The process of claim 53, wherein the sample of the multicomponent fluid is retrieved from the fluid-using process and transported to the reaction vessel, the sample is then titrated with the titration reagent(s), and the reaction vessel is then emptied and flush with methanol.

55. The process of claim 43, further comprising transferring the sample of the multicomponent fluid to the analyzer unit using the titration reagent(s).

56. The process of claim 55, further comprising drying the titration reagent(s) prior to its transport of sample to the analyzer unit.

57. The process of claim 43, wherein the steps of monitoring and comparing comprise Karl Fischer titration analysis of water in the multicomponent fluid, and converting the volume of titrant used in reaching an endpoint of the Karl Fischer titration analysis into units of concentration of water in the multicomponent fluid.

58. The process of claim 57, wherein the steps of monitoring and comparing comprise using a calculation factor determined by sample size, titration reagent concentration, titration reaction stoichiometry, and required result units.

59. The process of claim 58, wherein the calculation factor is determined as:

$$\text{Calculation Factor} = (C_{tit} \times RR \times U \times MW)/V_{samp}$$

wherein:

$C_{tit}$=Titrant Concentration (moles/liter)

RR=Reaction Ratio (moles of sample that will react with each mole of titrant)

U=Unit factor (using values selected from "1" for g/l, "0.1" for %, and "1000" for mg/l)

MW=Molecular Weight of sample species $V_{samp}$=Volume of sample taken (ml).

60. The process of claim 57, wherein the steps of monitoring and comparing comprise a process calibration.

61. The process of claim 57, wherein the steps of monitoring and comparing comprise outputting a visual display output of concentration of water in the multicomponent fluid.

62. The process of claim 57, wherein the steps of monitoring and comparing comprise selectively varying rate of sampling of the multicomponent fluid.

63. The process of claim 57, wherein the steps of monitoring and comparing comprise selectively smoothing a titration reaction curve from the Karl Fischer titration, to improve consistency of determined concentration of water in the multicomponent fluid.

64. The process of claim 57, wherein the steps of monitoring and comparing comprise determining endpoint of the Karl Fischer titration using an inflection point algorithm.

65. The process of claim 57, wherein the steps of monitoring and comparing comprise determining endpoint of the Karl Fischer titration using an algorithm selected from the group consisting of SEEK, SETPOINT and SEEK/SET endpoint algorithms.

66. The process of claim 57, wherein the steps of monitoring and comparing comprise importing titration data determined from the Karl Fischer titration into a spreadsheet.

67. The process of claim 36, wherein the output of the analyzer unit or control unit or both is transmitted to and presented on multiple output display units for visual observation, said output display units being positioned remotely in relation to one another.

68. The process of claim 36, wherein said monitoring and comparing steps are conducted by an automated monitor and comparator integrated into a semiconductor manufacturing facility and said process is fully automated.

69. The process of claim 68, wherein the automated monitor and comparator include a computer and a display for visual observation of outputted data.

70. The process of claim 36, wherein the multicomponent fluid comprises n-methyl pyrrolidone and water.

71. The process of claim 36, wherein the analyzer unit comprises a reaction vessel with mixer, and a titration reagent dispensing system, and said analyzer unit and sampling system are disposed in a unitary module within a housing.

72. The process of claim 36, wherein the analyzer unit comprises a reaction vessel with mixer, and a titration reagent dispensing system, and said analyzer unit and sampling system are disposed in a unit module within a housing.

73. The process of claim 36, wherein the steps of monitoring and comparing comprise conducting a specific analysis sequence, finding the endpoint(s) of the analysis, calculating and reporting analysis results.

74. The process of claim 73, wherein the reporting step comprises outputting said analysis results.

75. The process of claim 73, wherein the steps of monitoring and comparing comprise providing display means and selectively presenting Setup Screens, Calibration Screens, Service Screens, Data Screens, Run Screens and Sign-on Screens.

76. The process of claim 36, wherein the multicomponent fluid comprises a fluid selected from the group consisting of photoresist stripping compositions.

77. A semiconductor manufacturing facility, said semiconductor manufacturing facility performing at least one fluid-using process which employs a water containing multicomponent fluid, and comprising the integration into said semiconductor manufacturing facility of a multicomponent fluid composition monitoring and compositional control system for monitoring and adjusting the concentration of water in the multicomponent fluid composition of said at least one fluid-using process, said monitoring and compositional control system comprising:

(a) an analyzer unit constructed and arranged to monitor the concentration of water in the multicomponent fluid using a real-time Karl Fischer titration;

(b) a sampling system constructed and arranged to automatically retrieve a sample of the multicomponent fluid from a fluid-using process facility and deliver said sample to said analyzer unit;

(c) a control unit constructed and arranged to compare the results of the real-time Karl Fisher titration to preprogrammed specifications and responsively control dispensing of water from a source of water into the multicomponent fluid of said fluid-using process; and (d) a dispenser responsive to said control unit for dispensing water into said multicomponent fluid;

said monitoring and compositional control system including a first connection adapted for coupling with the fluid-using process facility to enable flow of multicomponent fluid from the fluid-using process facility to the sampling system, and a second connection adapted for coupling the control unit with the fluid-using process facility to control dispensing of water to the multicomponent fluid of the fluid-using processing facility;

said analyzer unit including at least one electrode for effecting the Karl Fisher titration; and a sampling chamber arranged to receive multicomponent fluid from the fluid-using process facility.

78. The semiconductor manufacturing facility of claim 77, wherein said at least one fluid-using process is selected from the group consisting of consisting of etching, photolithography, spin-on coatings application, wafer solvent drying operations, and photoresist and post-etch residue removal.

79. The semiconductor manufacturing facility of claim 77, wherein the multicomponent fluid comprises a semi-aqueous solvent medium.

80. The semiconductor manufacturing facility of claim 77, wherein said at least one fluid using process is a process for photoresist and post-etch residue removal and the multicomponent fluid comprises water and a photoresist stripping solvent.

81. The semiconductor manufacturing facility of claim 77, wherein said multicomponent fluid comprises water and organic solvent components.

82. The semiconductor manufacturing facility of claim 77, wherein the multicomponent fluid comprises an amine-based, alkaline aqueous solvent mixture.

83. The semiconductor manufacturing facility of claim 77 wherein said at least one electrode is a dual platinum sensor.

84. The semiconductor manufacturing facility of claim 83 wherein the analyzer unit is constructed and arranged to detect the endpoint of the Karl Fischer titration by a constant-current module.

85. The semiconductor manufacturing facility of claim 84, wherein the analyzer unit comprises a reaction vessel with mixer.

86. The semiconductor manufacturing facility of claim 85, wherein the reaction vessel with mixer is constructed and arranged to receive the sample of the multicomponent fluid and up to three analytical reagents.

87. The semiconductor manufacturing facility of claim 86, wherein the analyzer unit further comprises a reagent dispensing system.

88. The semiconductor manufacturing facility of claim 87, wherein the reagent dispensing system includes a multiplicity of glass burettes and a digital linear actuator controller for controllably dispensing reagents from said burettes.

89. The semiconductor manufacturing facility of claim 88, wherein the glass burettes contain titration reagent(s) and cleaning solvent.

90. The semiconductor manufacturing facility of claim 89, wherein the titration reagent(s) are dried prior to perforating the titration.

91. The semiconductor manufacturing facility of claim 89, wherein said burettes comprise three burettes respectively containing Karl Fischer solvent K in a first burette, methanol in a second burette, and Karl Fischer titrant K in a third burette.

92. The semiconductor manufacturing facility of claim 77, wherein the analyzer unit comprises at least one electrode, a reaction vessel with mixer and a reagent dispensing system disposed in a unitary module within a housing.

93. The semiconductor manufacturing facility of claim 92, farther comprising a transfer device for transferring the sample of the multicomponent fluid from the fluid-using process to the analyzer unit using one or more titration reagent(s) used in conducting the titration.

94. The semiconductor manufacturing facility of claim 93, wherein the one or more titration reagent(s) is dried prior to its transport of the sample to the analyzer unit.

95. The semiconductor manufacturing facility of claim 77, wherein said analyzer unit and control unit are constructed and arranged to carry out a sequence comprising retrieving the sample of the multicomponent fluid from the fluid-using process of the semiconductor manufacturing facility and transporting it to a reaction vessel in the analyzer unit, titrating the sample in the reaction vessel, emptying the reaction vessel, and flushing the reaction vessel with methanol.

96. The semiconductor manufacturing facility of claim 77, wherein the analyzer unit and control unit are constructed and arranged to carry out a sequence comprising converting the volume of titrant used in reaching an endpoint of the Karl Fischer titration analysis into units of concentration of water in the multicomponent fluid.

97. The semiconductor manufacturing facility of claim 96, wherein the analyzer unit and control unit are constructed and arranged to carry out said sequence using a calculation factor determined by sample size, titration reagent concentration, titration reaction stoichiometry, and required result units.

98. The semiconductor manufacturing facility of claim 96, wherein the analyzer unit and control unit are constructed and arranged to early out said sequence involving a process calibration.

99. The semiconductor manufacturing facility of claim 96, wherein the analyzer unit and control unit are constructed and arranged to carry out said sequence and to present a visual display output of said concentration of water in multicomponent fluid.

100. The semiconductor manufacturing facility of claim 77, wherein the analyzer unit and control unit are constructed and arranged to selectively smooth a titration reaction curve from the Karl Fischer titration, to improve consistency of determined concentration of water in the multicomponent fluid.

101. The semiconductor manufacturing facility of claim 77, wherein the analyzer unit and control unit are constructed and arranged to determine endpoint of the Karl Fischer titration using an inflection point algorithm.

102. The semiconductor manufacturing facility of claim 77, wherein the analyzer unit and control unit are constructed and arranged to determine endpoint of the Karl Fischer titration using an algorithm selected from the group consisting of SEEK, SETPOINT and SEEK/SET endpoint algorithms.

103. The semiconductor manufacturing facility of claim 77, wherein said sampling chamber comprises a bath which is connected to the fluid-using process facility whereby the multicomponent fluid of the fluid-using process facility flows to the bath and back to the fluid-using facility.

104. The semiconductor manufacturing facility of claim 103, wherein the control unit comprises pre-programmed specifications which pre-programmed specifications include the volume of bath, the frequency of monitoring and a titration calculation factor for calibration.

105. The improved semiconductor manufacturing facility of claim 103, wherein the bath comprises a recirculating bath.

106. The semiconductor manufacturing facility of claim 103, wherein the bath comprises a non-recirculating bath.

107. The semiconductor manufacturing facility of claim 77, wherein the fluid-using process of the semiconductor manufacturing facility includes a by-pass loop and the sample of the multicomponent fluid is retrieved from said by-pass loop.

108. The semiconductor manufacturing facility of claim 77, wherein the analyzer unit and control unit are constructed and arranged to selectively vary rate of sampling of the multicomponent fluid.

109. The semiconductor manufacturing facility of claim 77, wherein the control unit includes computational means and a display for visual observation of outputted data of the unit.

110. The improved semiconductor manufacturing facility of claim 77, wherein the control unit comprises computation means storing parameters for conducting a specific analysis sequence, finding the endpoint(s) of the analysis, calculating and reporting analysis results.

111. The semiconductor manufacturing facility of claim 77, wherein the control unit comprises display means for outputting said analysis results.

112. The semiconductor manufacturing facility of claim 77, wherein said analyzer unit and control unit are modular and are wall-mounted.

113. The semiconductor manufacturing facility of claim 77, wherein the control unit includes display means selectively presenting Setup Screens, Calibration Screens, Service Screens, Data Screens, Run Screens and Sign-on Screens.

114. The improved semiconductor manufacturing facility of claim 77, wherein the analyzer unit and control unit maintain a stable water concentration in the amine-based, alkaline aqueous solvent mixture over an extended time of at least 24 hours.

* * * * *